US012765047B2

(12) United States Patent
Jhan et al.

(10) Patent No.: US 12,765,047 B2

(45) Date of Patent: Oct. 13, 2026

(54) FIELD EFFECT TRANSISTOR AND METHOD

(71) Applicant: Taiwan Semiconductor Manufacturing Co., Ltd., Hsinchu (TW)

(72) Inventors: Yi-Ruei Jhan, Hsinchu (TW); Kuan-Ting Pan, Hsinchu (TW); Shi-Ning Ju, Hsinchu (TW); Kuo-Cheng Chiang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 589 days.

(21) Appl. No.: 17/476,418

(22) Filed: Sep. 15, 2021

(65) Prior Publication Data

US 2022/0344333 A1 Oct. 27, 2022

Related U.S. Application Data

(60) Provisional application No. 63/178,688, filed on Apr. 23, 2021.

(51) Int. Cl.

| | |
|---|---|
| ***H10D 84/85*** | (2025.01) |
| ***H10D 30/01*** | (2025.01) |
| ***H10D 30/67*** | (2025.01) |
| ***H10D 62/10*** | (2025.01) |
| ***H10D 64/01*** | (2025.01) |
| ***H10D 84/01*** | (2026.01) |
| ***H10D 84/03*** | (2025.01) |
| ***H10P 14/20*** | (2026.01) |

(52) U.S. Cl.

CPC ........... *H10D 84/85* (2025.01); *H10D 30/031* (2025.01); *H10D 30/6735* (2025.01); *H10D 30/6757* (2025.01); *H10D 62/118* (2025.01); *H10D 64/017* (2025.01); *H10D 64/018* (2025.01); *H10D 84/0167* (2025.01); *H10D 84/0188* (2025.01); *H10D 84/038* (2025.01); *H10P 14/3452* (2026.01)

(58) Field of Classification Search

CPC ............. H01L 29/42392; H01L 29/775; H01L 21/823481; H01L 29/78696; H10D 84/038; H10D 84/0158; H10D 84/0151; H10D 64/017; H10D 30/6735; H10D 30/6757

See application file for complete search history.

(56) References Cited

U.S. PATENT DOCUMENTS

| | | | |
|---|---|---|---|
| 9,236,267 | B2 | 1/2016 | De et al. |
| 9,502,265 | B1 | 11/2016 | Jiang et al. |
| 9,520,466 | B2 | 12/2016 | Holland et al. |

(Continued)

*Primary Examiner* — Samuel A Gebremariam

*Assistant Examiner* — Jonas T Beardsley

(74) *Attorney, Agent, or Firm* — Seed IP Law Group

(57) ABSTRACT

A device includes a substrate, a first semiconductor channel over the substrate, a second semiconductor channel over the substrate and laterally offset from the first semiconductor channel, an isolation feature embedded in the substrate and laterally between the first and second semiconductor channels, a first liner layer laterally surrounding the isolation feature between the isolation feature and the first semiconductor channel, and a second liner layer laterally surrounding the first liner layer between the first liner layer and the first semiconductor channel.

20 Claims, 28 Drawing Sheets

(56) References Cited

U.S. PATENT DOCUMENTS

| | | | | |
|---|---|---|---|---|
| 9,520,482 | B1 | 12/2016 | Chang et al. | |
| 9,536,738 | B2 | 1/2017 | Huang et al. | |
| 9,576,814 | B2 | 2/2017 | Wu et al. | |
| 9,608,116 | B2 | 3/2017 | Ching et al. | |
| 9,786,774 | B2 | 10/2017 | Colinge et al. | |
| 9,853,101 | B2 | 12/2017 | Peng et al. | |
| 9,881,993 | B2 | 1/2018 | Ching et al. | |
| 2014/0104061 | A1* | 4/2014 | Luo | G08B 13/1445 340/572.8 |
| 2017/0104061 | A1* | 4/2017 | Peng | H10D 62/121 |
| 2017/0372969 | A1* | 12/2017 | Ching | H10D 84/038 |
| 2019/0165127 | A1* | 5/2019 | Ching | H10D 84/0158 |
| 2020/0066718 | A1* | 2/2020 | Li | H10D 84/0151 |
| 2020/0091007 | A1* | 3/2020 | Lee | H10D 84/0158 |
| 2020/0105604 | A1* | 4/2020 | Lin | H01L 27/0886 |

* cited by examiner

FIELD EFFECT TRANSISTOR AND METHOD

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
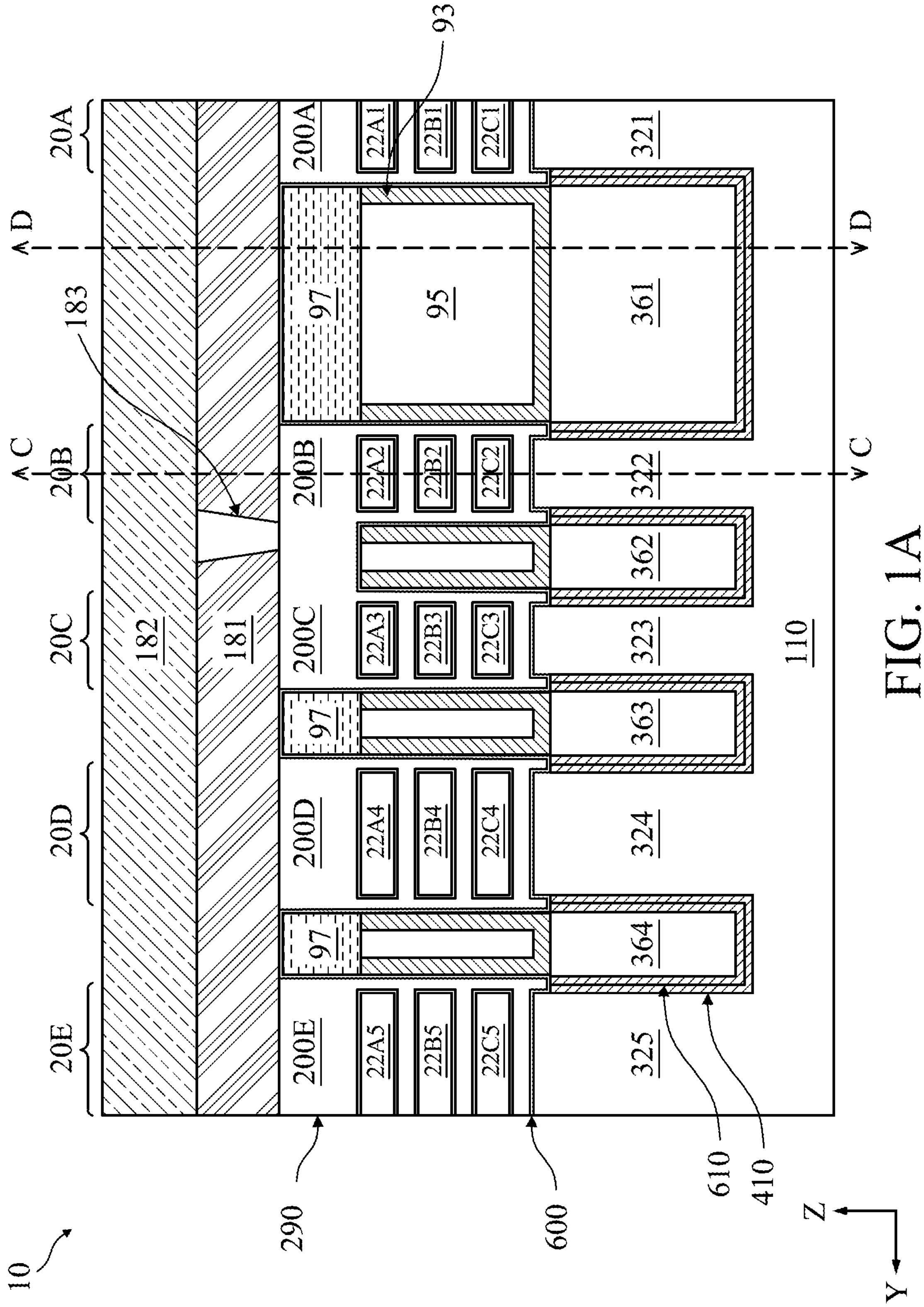
FIGS. 1A-1D are diagrammatic cross-sectional side views of a portion of an IC device fabricated according to embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature’s relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Terms indicative of relative degree, such as “about,” “substantially,” and the like, should be interpreted as one having ordinary skill in the art would in view of current technological norms. Generally, the term “substantially” indicates a tighter tolerance than the term “about.” For example, a thickness of “about 100 units” will include a larger range of values, e.g., 70 units to 130 units (+/−30%), than a thickness of “substantially 100 units,” which will include a smaller range of values, e.g., 95 units to 105 units (+/−5%). Again, such tolerances (+/−30%, +/−5%, and the like) may be process- and/or equipment-dependent, and should not be interpreted as more or less limiting than a person having ordinary skill in the art would recognize as normal for the technology under discussion, other than that “about” as a relative term is not as stringent as “substantially” when used in a similar context.

The present disclosure is generally related to semiconductor devices, and more particularly to field-effect transistors (FETs), such as planar FETs, three-dimensional fin-line FETs (FinFETs), or gate-all-around (GAA) devices. In advanced technology nodes, inactive (or “dummy”) fins may be formed in a self-aligned process using a liner layer that is removed prior to a gate replacement operation. Protection of active fins or nanosheet stacks during removal of the liner layer is generally accomplished by a pad oxide hard mask layer overlying the active fins or nanosheet stacks. The pad oxide hard mask layer may be damaged during recessing of shallow trench isolation (STI) structures that isolate the active fins or nanosheet stacks, due to the STI structures having similar etch selectivity to the pad oxide hard mask layer. Two protective liner layers may be employed in the embodiments which cover the pad oxide hard mask layer during recessing of the STI structures, such that the pad oxide hard mask layer remains intact following the recessing operation. The intact pad oxide hard mask layer provides good protection of the active fins or nanosheet stacks during removal of the liner layer prior to gate replacement, improving yield of the semiconductor device.

The gate all around (GAA) transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

Figure 1B:
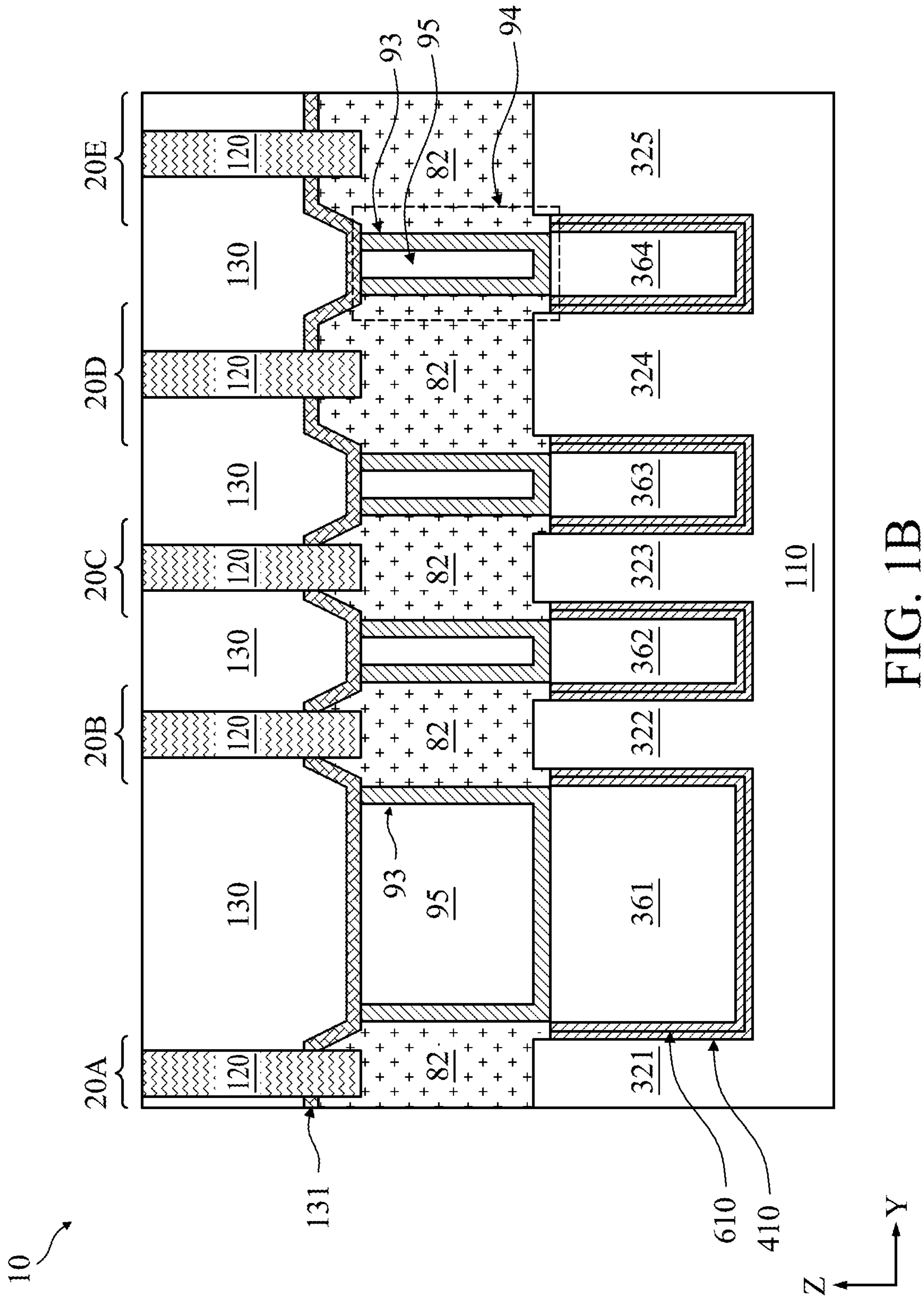

FIGS. 1A-1D illustrate diagrammatic cross-sectional side views of a portion of an IC device 10 fabricated according to embodiments of the present disclosure, where the IC device 10 includes gate-all-around (GAA) devices 20A-20E. FIG. 1A and FIG. 1B are diagrammatic side views of the portion of the IC device 10 including the GAA devices 20A-20E. Certain features are removed from view intentionally in the side views of FIG. 1A and FIG. 1B for simplicity of illustration. The GAA devices 20A-20E may include at least an N-type FET (NFET) or a P-type FET (PFET) in some embodiments. Integrated circuit devices such as the IC device 10 frequently include transistors having different threshold voltages based on their function in the IC device. For example, input/output (IO) transistors typically have the highest threshold voltages, core logic transistors typically have the lowest threshold voltages, and a third threshold voltage between that of the IO transistors and that of the core logic transistors may also be employed for certain other functional transistors, such as static random access memory (SRAM) transistors. Some circuit blocks within the IC device 10 may include two or more NFETs and/or PFETs of two or more different threshold voltages.

In FIG. 1A, the GAA devices 20A-20E are formed over and/or in a substrate 110, and generally include gate structures 200A-200E straddling semiconductor channels, alternately referred to as "nanostructures," located over semiconductor fins 321-325 protruding from, and separated by, isolation structures 361-364. The semiconductor channels are labeled "22AX" to "22CX," where "X" is an integer from 1 to 5, corresponding to the five transistors 20A-20E, respectively. Each gate structure 200A-200E controls current flow through the channels 22A1-22C5. The IC device 10 is described in terms of the GAA devices 20A-20E. Embodiments of the disclosure are also applicable to IC devices that include FinFET devices.

In many IC devices, it is preferable for the gate structures of two or more neighboring GAA devices to be electrically connected. In a typical process, material layers of gate structures are formed over a large number of adjacent semiconductor fins, and isolation structures formed before or after the material layers are used to "cut" the material layers to isolate certain portions of the material layers from other portions. Each portion of the material layers may be one or more gate structures corresponding to one or more GAA devices. For illustrative purposes, in the configuration shown in FIGS. 1A-1D, two gate isolation structures 97 isolate the five gate structures 200A-200E, such that the gate structures 200B, 200C are electrically connected, and the gate structure 200A, the gate structures 200B-200C, the gate structure 200D and the gate structure 200E are electrically isolated from each other. The gate isolation structures 97 are alternatively referred to as "dielectric plugs 97." The gate isolation structures 97 contact inactive fin structures 94 (see also FIG. 1B and FIG. 1D), which include dielectric liners 93 and oxide layers 95. The inactive fin structures 94 extend from the upper surface of isolation structures 361-364 to the upper surface of the semiconductor channels 22A1, 22A2, 22A3, 22A4, 22A5. In some embodiments, the inactive fin structures 94 extend about 5 nm to about 25 nm above the upper surface of the channels 22A1, 22A2, 22A3, 22A4, 22A5. In the various embodiments of the disclosure, the inactive fin structures 94 are formed in a self-aligned process prior to formation of the gate structures 200A-200E, and the gate isolation structures 97 are formed in another self-aligned process prior to formation of the gate structures 200A-200E.

Figure 1C:
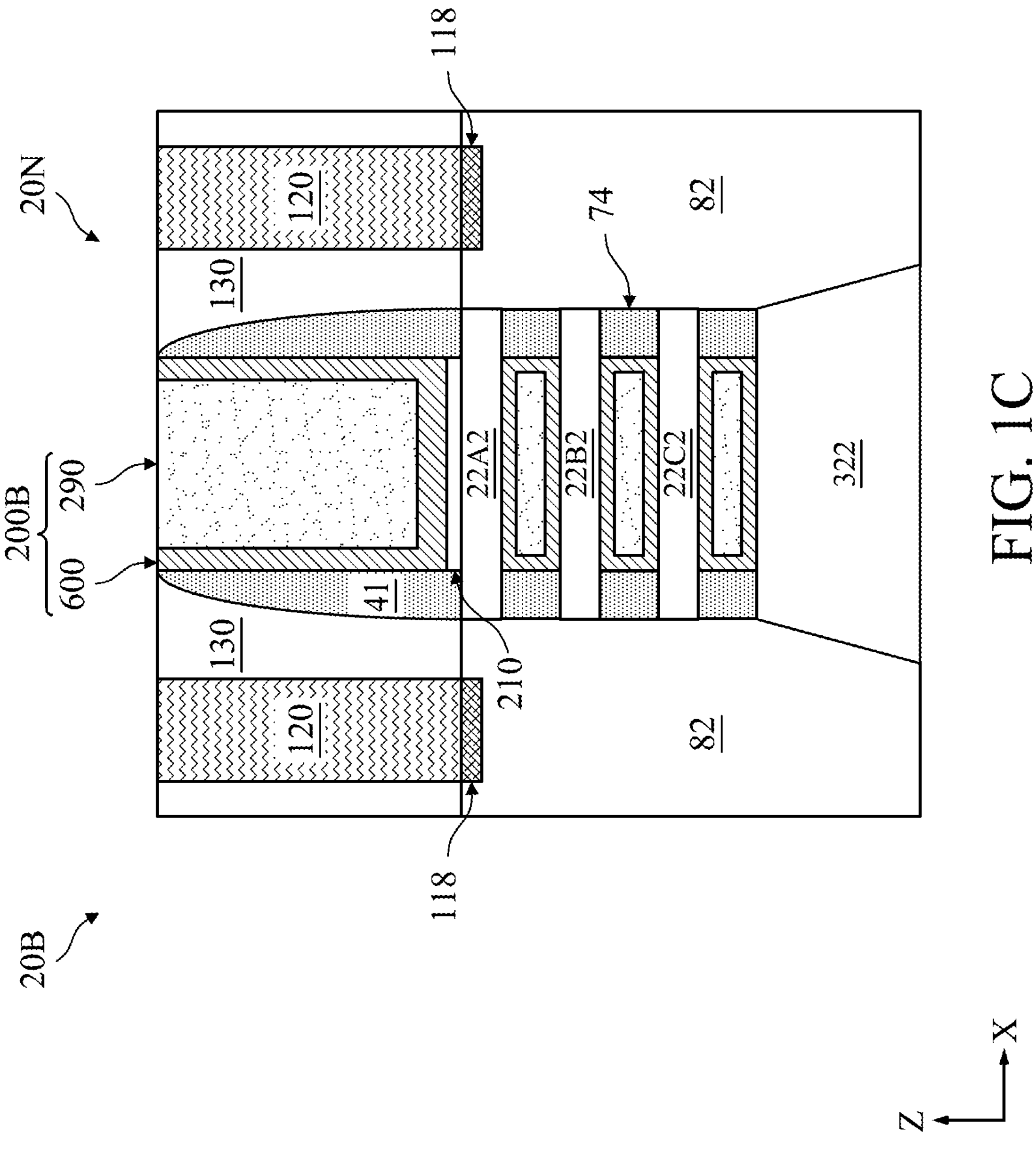

Referring to FIG. 1C, the cross-sectional views of the IC device 10 in FIG. 1C is taken along an X-Z plane, where the X-direction is the horizontal direction, and the Z-direction is the vertical direction. The view in FIG. 1C is taken along the cross-sectional line C-C illustrated in FIG. 1A. The cross-sectional view in FIG. 1C shows a single GAA device 20B of the GAA devices 20A-20E for simplicity of illustration, and the related description is generally applicable to the other GAA devices 20A, 20C-20E. The channels 22A2-22C2 are laterally abutted by source/drain features 82, and covered and surrounded by the gate structure 200B. The gate structure 200B controls flow of electrical current through the channels 22A2-22C2 to and from the source/drain features 82 based on voltages applied at the gate structure 200B and at the source/drain features 82.

In some embodiments, the fin structure 322 includes silicon. In some embodiments, the GAA device 20B is an NFET, and the source/drain features 82 thereof include silicon phosphorous (SiP) or other suitable material. In some embodiments, the GAA device 20B is a PFET, and the source/drain features 82 thereof include silicon germanium (SiGe) or other suitable material.

The channels 22A2-22C2 each include a semiconductive material, for example silicon or a silicon compound, such as silicon germanium, or the like. The channels 22A2-22C2 are nanostructures (e.g., having sizes that are in a range of a few nanometers) and may also each have an elongated shape and extend in the X-direction. In some embodiments, the channels 22A2-22C2 each have a nanowire (NW) shape, a nanosheet (NS) shape, a nanotube (NT) shape, or other suitable nanoscale shape. The cross-sectional profile of the channels 22A2-22C2 may be rectangular, round, square, circular, elliptical, hexagonal, or combinations thereof.

In some embodiments, the lengths (e.g., measured in the X-direction) of the channels 22A2-22C2 may be different from each other, for example due to tapering during a fin etching process. In some embodiments, length of the channel 22A1 may be less than a length of the channel 22B1, which may be less than a length of the channel 22C1. The channels 22A2-22C2 each may not have uniform thickness, for example due to a channel trimming process used to expand spacing (e.g., measured in the Z-direction) between the channels 22A2-22C2 to increase gate structure fabrication process window. For example, a middle portion of each of the channels 22A2-22C2 may be thinner than the two ends of each of the channels 22A2-22C2. Such shape may be collectively referred to as a "dog-bone" shape.

In some embodiments, the spacing between the channels 22A2-22C2 (e.g., between the channel 22B2 and the channel 22A2 or the channel 22C2) is in a range between about 8 nanometers (nm) and about 12 nm. In some embodiments, a thickness (e.g., measured in the Z-direction) of each of the channels 22A2-22C2 is in a range between about 5 nm and about 8 nm. In some embodiments, a width (e.g., measured in the Y-direction, not shown in FIG. 1D, orthogonal to the X-Z plane) of each of the channels 22A2-22C2 is at least about 8 nm.

The gate structure 200B is disposed over and between the channels 22A2-22C2, respectively. In some embodiments, the gate structure 200B is disposed over and between the channels 22A2-22C2, which are silicon channels for N-type devices or silicon germanium channels for P-type devices. In some embodiments, the gate structure 200B includes an interfacial layer (IL) 210, one or more gate dielectric layers 600 and a metal fill layer 290. The gate structure 200B may include other material layers not shown in FIG. 1C for simplicity of illustration. The layers of the gate structure 200B are described in detail with reference to FIG. 14.

The interfacial layer 210, which may be an oxide of the material of the channels 22A2-22C2, is formed on exposed areas of the channels 22A2-22C2 and the top surface of the fin 322. The interfacial layer 210 promotes adhesion of the gate dielectric layers 600 to the channels 22A2-22C2. In some embodiments, the interfacial layer 210 has thickness of about 5 Angstroms (A) to about 50 Angstroms (A). In some embodiments, the interfacial layer 210 has thickness of about 10 A. The interfacial layer 210 having thickness that is too thin may exhibit voids or insufficient adhesion properties. The interfacial layer 210 being too thick consumes gate fill window, which is related to threshold voltage tuning and resistance as described above. In some embodiments, the interfacial layer 210 is doped with a dipole, such as lanthanum, for threshold voltage tuning.

In some embodiments, the gate dielectric layer 600 includes at least one high-k gate dielectric material, which may refer to any dielectric material having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In some embodiments, the gate dielectric layer 600 has thickness of about 5 A to about 100 A.

In some embodiments, the gate dielectric layer 600 may include dopants, such as metal ions driven into the high-k gate dielectric from $La_2O_3$, MgO, $Y_2O_3$, $TiO_2$, $Al_2O_3$, $Nb_2O_5$, or the like, or boron ions driven in from $B_2O_3$, at a concentration to achieve threshold voltage tuning. As one example, for N-type transistor devices, lanthanum ions in higher concentration reduce the threshold voltage relative to layers with lower concentration or devoid of lanthanum ions, while the reverse is true for P-type devices. In some embodiments, the gate dielectric layer 600 of certain transistor devices (e.g., IO transistors) is devoid of the dopant that is present in certain other transistor devices (e.g., N-type core logic transistors or P-type IO transistors). In N-type IO transistors, for example, relatively high threshold voltage is desirable, such that it may be preferable for the IO transistor high-k dielectric layers to be free of lanthanum ions, which would otherwise reduce the threshold voltage.

Figure 14:
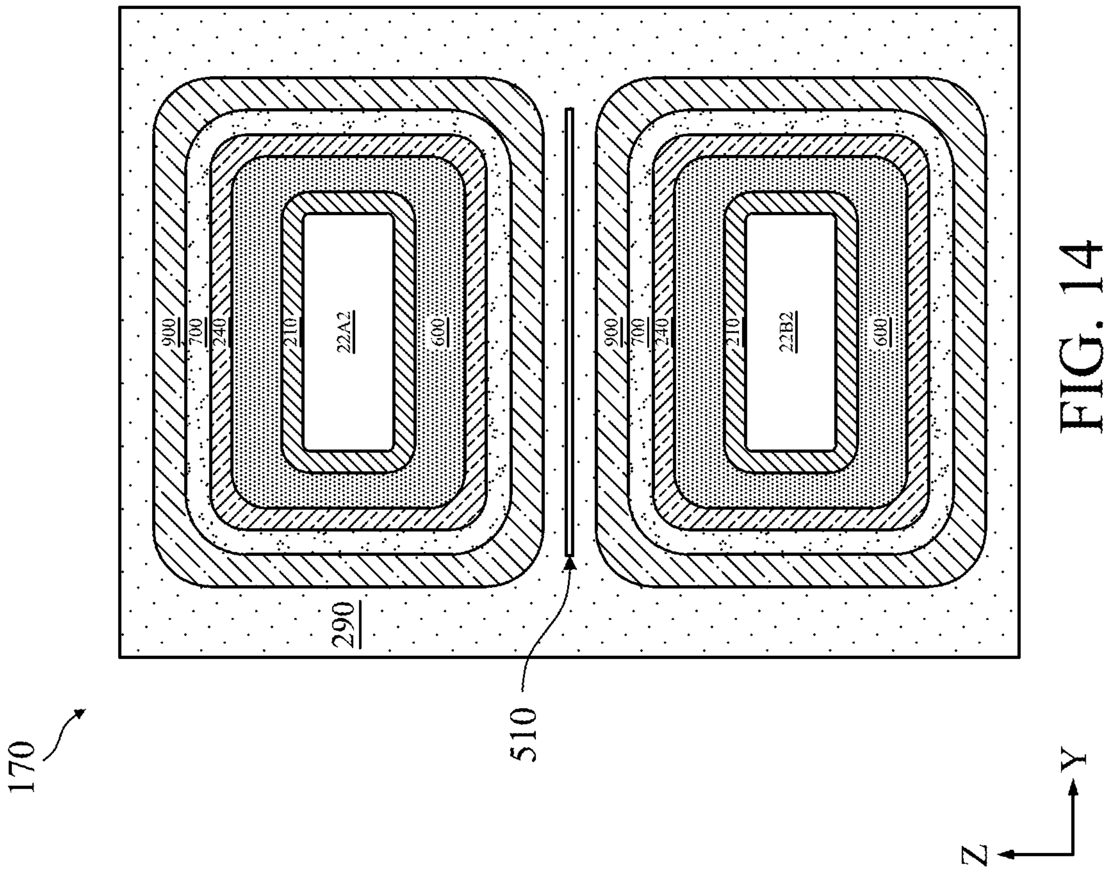

In some embodiments, the gate structure 200B further includes one or more work function metal layers, represented collectively as work function metal layer 900 (see FIG. 14). When configured as an NFET, the work function metal layer 900 of the GAA device 20B may include at least an N-type work function metal layer, an in-situ capping layer, and an oxygen blocking layer. In some embodiments, the N-type work function metal layer is or comprises an N-type metal material, such as TiAlC, TiAl, TaAlC, TaAl, or the like. The in-situ capping layer is formed on the N-type work function metal layer, and may comprise TiN, TiSiN, TaN, or another suitable material. The oxygen blocking layer is formed on the in-situ capping layer to prevent oxygen diffusion into the N-type work function metal layer, which would cause an undesirable shift in the threshold voltage. The oxygen blocking layer may be formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the work function metal layer 900 includes more or fewer layers than those described.

The work function metal layer 900 may further include one or more barrier layers comprising a metal nitride, such as TiN, WN, MoN, TaN, or the like. Each of the one or more barrier layers may have thickness ranging from about 5 A to about 20 A. Inclusion of the one or more barrier layers provides additional threshold voltage tuning flexibility. In general, each additional barrier layer increases the threshold voltage. As such, for an NFET, a higher threshold voltage device (e.g., an IO transistor device) may have at least one or more than two additional barrier layers, whereas a lower threshold voltage device (e.g., a core logic transistor device) may have few or no additional barrier layers. For a PFET, a higher threshold voltage device (e.g., an IO transistor device) may have few or no additional barrier layers, whereas a lower threshold voltage device (e.g., a core logic transistor device) may have at least one or more than two additional barrier layers. In the immediately preceding discussion, threshold voltage is described in terms of magnitude. As an example, an NFET TO transistor and a PFET TO transistor may have similar threshold voltage in terms of magnitude, but opposite polarity, such as +1 Volt for the NFET IO transistor and −1 Volt for the PFET TO transistor. As such, because each additional barrier layer increases threshold voltage in absolute terms (e.g., +0.1 Volts/layer), such an increase confers an increase to NFET transistor threshold voltage (magnitude) and a decrease to PFET transistor threshold voltage (magnitude).

The gate structure 200B also includes metal fill layer 290. The metal fill layer 290 may include a conductive material such as tungsten, cobalt, ruthenium, iridium, molybdenum, copper, aluminum, or combinations thereof. Between the channels 22A2-22C2, the metal fill layer 290 are circumferentially surrounded (in the cross-sectional view) by the one or more work function metal layers 900, which are then circumferentially surrounded by the gate dielectric layers 600. The gate structure 200B may also include a glue layer that is formed between the one or more work function layers 900 and the metal fill layer 290 to increase adhesion. The glue layer is not specifically illustrated in FIGS. 1A-1D for simplicity.

The GAA devices 20A-20E also include gate spacers 41 and inner spacers 74 that are disposed on sidewalls of the gate dielectric layer 600 and the IL 210. The inner spacers 74 are also disposed between the channels 22A2-22C2. The gate spacers 41 and the inner spacers 74 may include a dielectric material, for example a low-k material such as SiOCN, SiON, SiN, or SiOC. In some embodiments, the gate spacers 41 include one or more dielectric layers, such as two dielectric layers or three dielectric layers.

The GAA devices 20A-20E may further include source/drain contacts 120 (shown in FIG. 1B) that are formed over the source/drain features 82. The source/drain contacts 120 may include a conductive material such as tungsten, cobalt, ruthenium, iridium, molybdenum, copper, aluminum, or combinations thereof. The source/drain contacts 120 may be surrounded by barrier layers (not shown), such as SiN or TiN, which help prevent or reduce diffusion of materials from and into the source/drain contacts 120. A silicide layer 118 may also be formed between the source/drain features 82 and the source/drain contacts 120, so as to reduce the source/drain contact resistance. The silicide layer may contain a metal silicide material, such as cobalt silicide in some embodiments, or TiSi in some other embodiments.

The GAA devices 20A-20E further include an interlayer dielectric (ILD) 130. The ILD 130 provides electrical isolation between the various components of the GAA devices 20A-20E discussed above, for example between the gate structure 200B and the source/drain contacts 120. An etch stop layer 131 (see FIG. 1D) may be formed prior to forming the ILD 130, and may be positioned laterally between the ILD 130 and the gate spacers 41 and vertically between the ILD 130 and the source/drain features 82.

Figure 1D:
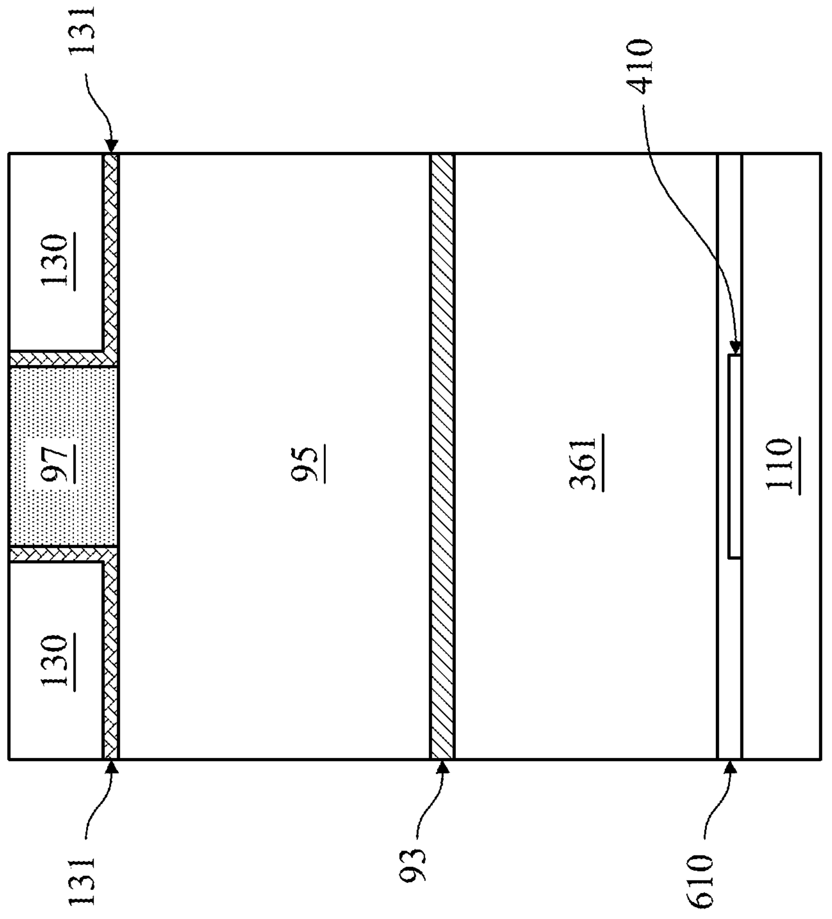

FIG. 1D is a cross-sectional side view of the IC device 10. The view in FIG. 1D is taken along the cross-sectional line D-D illustrated in FIG. 1A. In some embodiments, the inactive fins 94 comprise a low-k dielectric material, such as SiN, SiCN, SiOCN, SiOC, or the like.

Additional details pertaining to the fabrication of GAA devices are disclosed in U.S. Pat. No. 10,164,012, titled "Semiconductor Device and Manufacturing Method Thereof" and issued on Dec. 25, 2018, as well as in U.S. Pat.

No. 10,361,278, titled "Method of Manufacturing a Semiconductor Device and a Semiconductor Device" and issued on Jul. 23, 2019, the disclosures of each which are hereby incorporated by reference in their respective entireties.

Figure 15A:
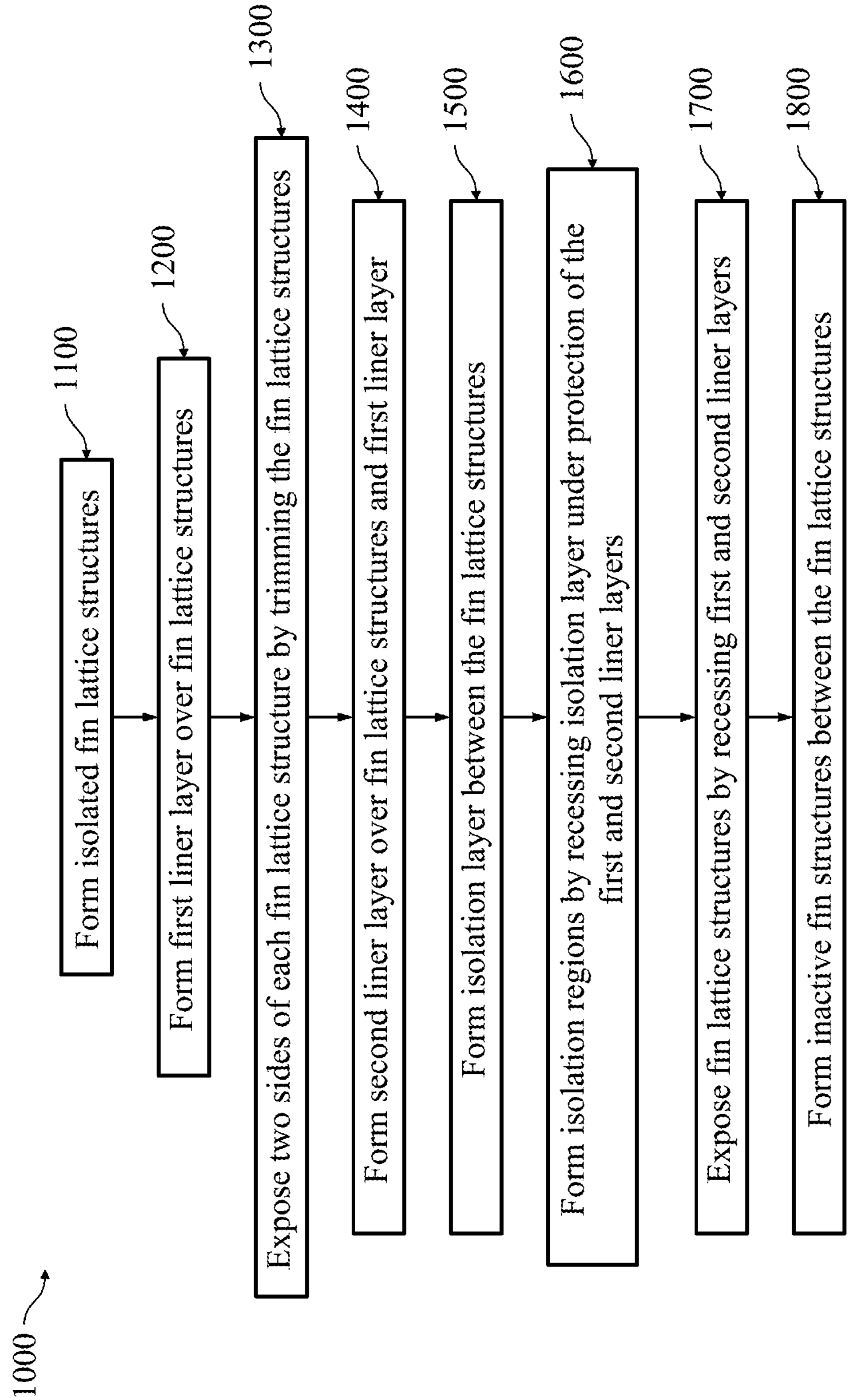
FIGS. 15A and 15B are a flowchart illustrating a method of fabricating a semiconductor device according to various aspects of the present disclosure.
Figure 15B:
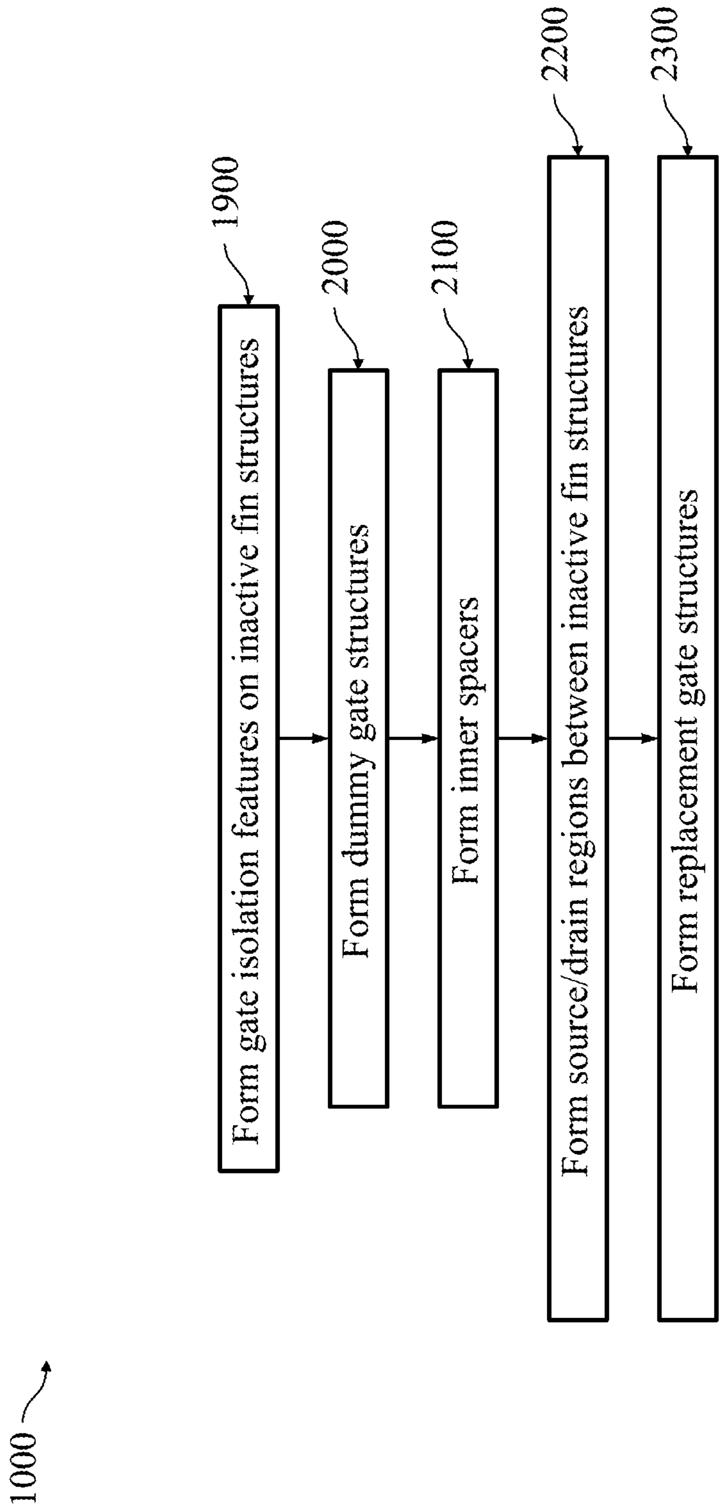

FIGS. 15A and 15B illustrate a flowchart of a method 1000 for forming an IC device or a portion thereof from a workpiece, according to one or more aspects of the present disclosure. Method 1000 is merely an example and is not intended to limit the present disclosure to what is explicitly illustrated in method 1000. Additional acts can be provided before, during and after the method 1000, and some acts described can be replaced, eliminated, or moved around for additional embodiments of the methods. Not all acts are described herein in detail for reasons of simplicity. Method 1000 is described below in conjunction with fragmentary perspective and/or cross-sectional views of a workpiece, shown in FIGS. 2-14, at different stages of fabrication according to embodiments of method 1000. For avoidance of doubt, throughout the figures, the X direction is perpendicular to the Y direction and the Z direction is perpendicular to both the X direction and the Y direction. It is noted that, because the workpiece may be fabricated into a semiconductor device, the workpiece may be referred to as the semiconductor device as the context requires.

Figure 2:
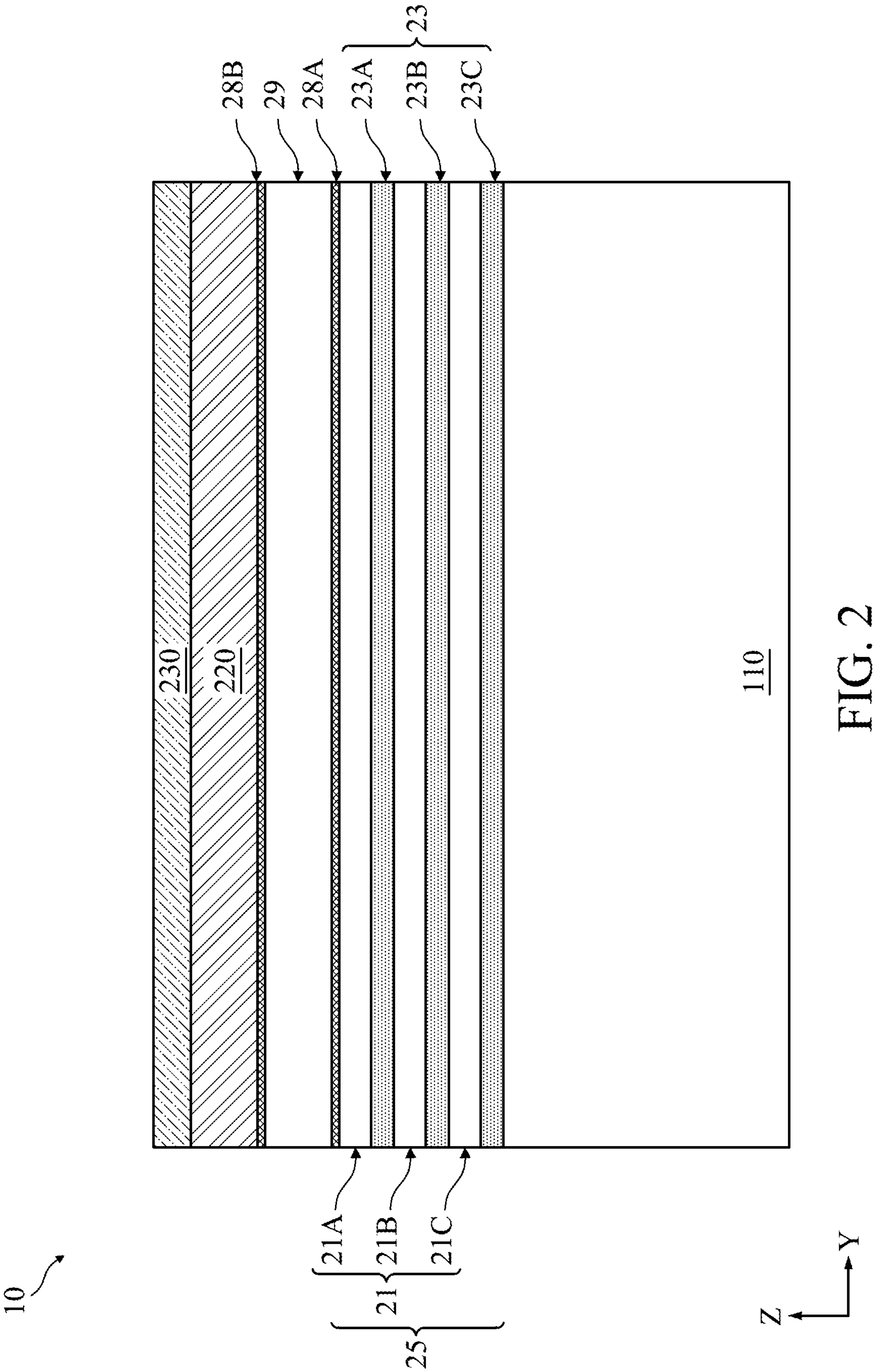
FIGS. 2-14 are views of various embodiments of an IC device of at various stages of fabrication according to various aspects of the present disclosure.

In FIG. 2, a substrate 110 is provided. The substrate 110 may be a semiconductor substrate, such as a bulk semiconductor, or the like, which may be doped (e.g., with a p-type or an n-type dopant) or undoped. The semiconductor material of the substrate 110 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof. Other substrates, such as single-layer, multi-layered, or gradient substrates may be used.

Further in FIG. 2, a multi-layer stack 25 or "lattice" is formed over the substrate 110 of alternating layers of first semiconductor layers 21A-21C (collectively referred to as first semiconductor layers 21) and second semiconductor layers 23A-23C (collectively referred to as second semiconductor layers 23). In some embodiments, the first semiconductor layers 21 may be formed of a first semiconductor material suitable for n-type nanoFETs, such as silicon, silicon carbide, or the like, and the second semiconductor layers 23 may be formed of a second semiconductor material suitable for p-type nanoFETs, such as silicon germanium or the like. Each of the layers of the multi-layer stack 25 may be epitaxially grown using a process such as chemical vapor deposition (CVD), atomic layer deposition (ALD), vapor phase epitaxy (VPE), molecular beam epitaxy (MBE), or the like. As shown in FIG. 2, an oxide layer 28A and hard mask layer 29 are formed over the top first semiconductor layer 21A. In some embodiments, the oxide layer 28A is a pad oxide layer, and the hard mask layer 29 may include silicon. In some embodiments, the hard mask layer 29 includes SiOCN, or another suitable silicon-based dielectric. In some embodiments, a second oxide layer 28B is formed over the hard mask layer 29. Formation of the second oxide layer 28B may be similar to that of the oxide layer 28A. Following formation of the second oxide layer 28B, hard mask layers 220, 230 may be formed over the second oxide layer 28B. In some embodiments, the hard mask layers 220, 230 are or comprise any suitable material for forming a hard mask, such as silicon, SiOCN, SiCN, SiON, or the like. In some embodiments, the hard mask layer 220 has different etch selectivity than the hard mask layer 230, and is or includes a different material than the hard mask layer 230.

Three layers of each of the first semiconductor layers 21 and the second semiconductor layers 23 are illustrated. In some embodiments, the multi-layer stack 25 may include one or two each or four or more each of the first semiconductor layers 21 and the second semiconductor layers 23. Although the multi-layer stack 25 is illustrated as including a second semiconductor layer 23C as the bottommost layer, in some embodiments, the bottommost layer of the multi-layer stack 25 may be a first semiconductor layer 21.

Due to high etch selectivity between the first semiconductor materials and the second semiconductor materials, the second semiconductor layers 23 of the second semiconductor material may be removed without significantly removing the first semiconductor layers 21 of the first semiconductor material, thereby allowing the first semiconductor layers 21 to be patterned to form channel regions of nanoFETs. In some embodiments, the first semiconductor layers 21 are removed and the second semiconductor layers 23 are patterned to form channel regions. The high etch selectivity allows the first semiconductor layers 21 of the first semiconductor material to be removed without significantly removing the second semiconductor layers 23 of the second semiconductor material, thereby allowing the second semiconductor layers 23 to be patterned to form channel regions of nanoFETs.

Figure 3:
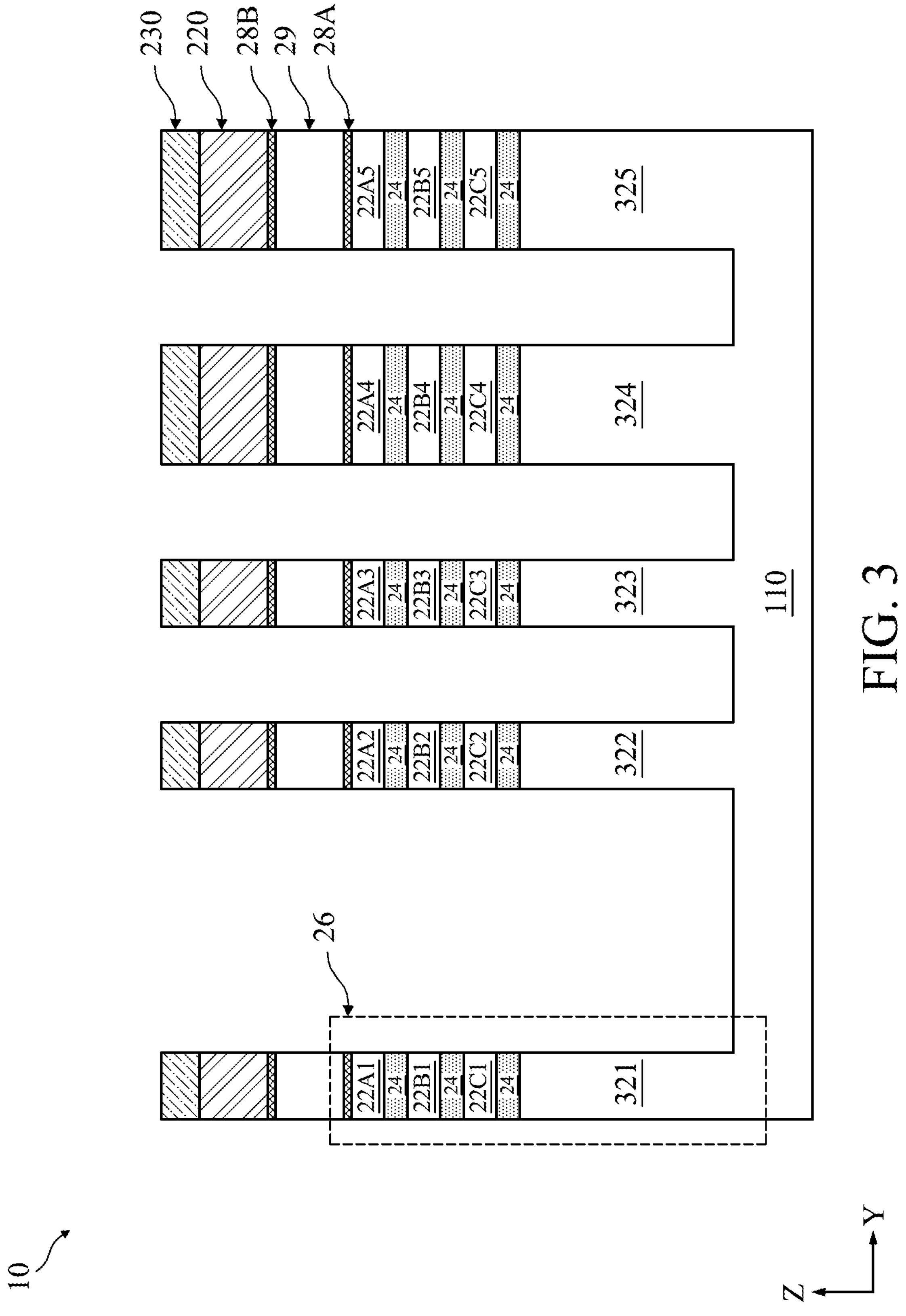

In FIG. 3, fins 321-325 are formed in the substrate 110 and nanostructures 22, 24 are formed in the multi-layer stack 25 corresponding to operation 1100 of FIG. 15A. In some embodiments, the nanostructures 22, 24 and the fins 32 may be formed by etching trenches in the multi-layer stack 25 and the substrate 110. The etching may be any acceptable etch process, such as a reactive ion etch (ME), neutral beam etch (NBE), the like, or a combination thereof. The etching may be anisotropic. First nanostructures 22A1-22C5 (also referred to as "channels") are formed from the first semiconductor layers 21, and second nanostructures 24 are formed from the second semiconductor layers 23. Distance between adjacent fins 321-325 and nanostructures 22, 24 in the Y-direction may be from about 18 nm to about 100 nm.

The fins 321-325 and the nanostructures 22, 24 may be patterned by any suitable method. For example, one or more photolithography processes, including double-patterning or multi-patterning processes, may be used to form the fins 321-325 and the nanostructures 22, 24. Generally, double-patterning or multi-patterning processes combine photolithography and self-aligned processes, allowing for pitches smaller than what is otherwise obtainable using a single, direct photolithography process. As an example of one multi-patterning process, a sacrificial layer may be formed over a substrate and patterned using a photolithography process. Spacers are formed alongside the patterned sacrificial layer using a self-aligned process. The sacrificial layer is then removed, and the remaining spacers may then be used to pattern the fins 321-325. In some embodiments, the hard mask layers 220, 230, 29 are patterned, for example by photolithography processes, then the pattern is transferred by an etch process to form the fins 321-325 and the nanostructures 22, 24. Each of the fins 321-325 and its overlying nanostructures 22, 24 may be collectively referred to as a "fin stack." A fin stack 26 including the fin 321 and the nanostructures 22A1, 22B1, 22C1, 24 is outlined by a dashed line in FIG. 3. Five fin stacks 26 are shown in FIG. 3, though fewer or more than five fin stacks 26 may also be formed by the patterning process.

FIG. 3 illustrates the fins 321-325 having vertically straight sidewalls. In some embodiments, the sidewalls are substantially vertical (non-tapered), such that width of the fins 321-325 and the nanostructures 22, 24 is substantially similar, and each of the nanostructures 22, 24 is rectangular in shape. In some embodiments, the fins 321-325 have tapered sidewalls, such that a width of each of the fins 321-325 and/or the nanostructures 22, 24 continuously increases in a direction towards the substrate 110. In such embodiments, each of the nanostructures 22, 24 may have a different width and be trapezoidal in shape. In some embodiments, certain of the fins 321-325 (e.g., the fins 324, 325) have greater width than others of the fins 321-325 (e.g., the fins 321, 322, 323).

Figure 4:
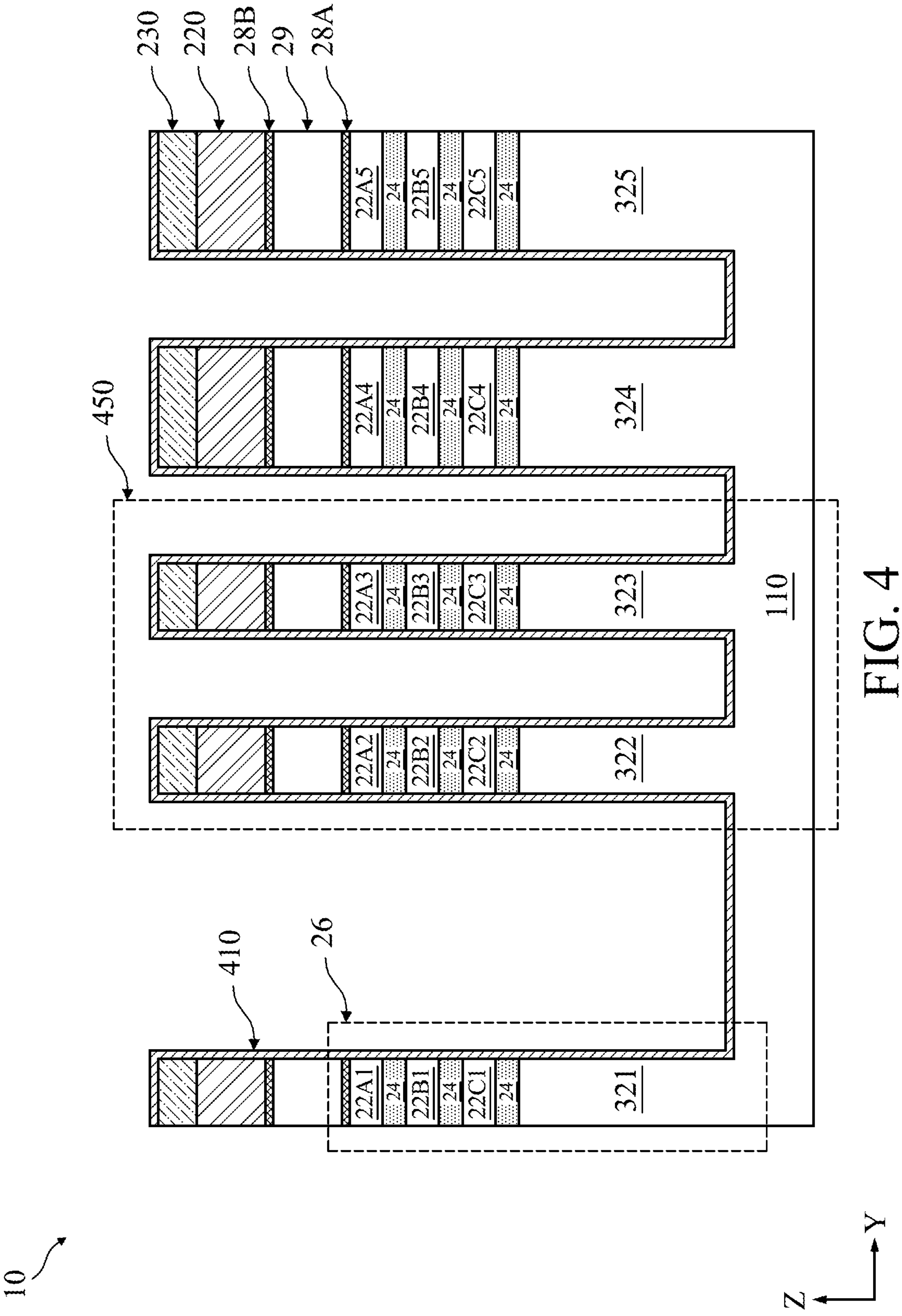

In FIG. 4, a first liner layer 410 is formed, corresponding to operation 1200 of FIG. 15A. In some embodiments, the first liner layer 410 is formed conformally over the substrate 110, the fins 321-325, the nanostructures 22, 24, the oxide layers 28A, 28B and the hard mask layers 29, 220, 230. Because subsequently formed shallow trench isolation (STI) regions are formed of the same material (e.g., silicon oxide) as the oxide layers 28A, 28B, when the STI regions are recessed, the oxide layers 28A, 28B are vulnerable to the etching process. In many cases, when the oxide layers 28A, 28B are damaged during the etching process, the hard mask layers 29, 220, 230 may exhibit peeling, which is detrimental to yield. The first liner layer 410 is configured to protect the oxide layers 28A, 28B in the etching process used to recess the STI regions. Generally, the first liner layer 410 is formed of a material having different etch selectivity than the oxide layers 28A, 28B and the STI regions. In some embodiments, the first liner layer 410 is formed of silicon or silicon germanium. In some embodiments, the first liner layer 410 is formed of a silicon-based dielectric, such as SiC, SiN, SiCN, or other dielectric material (e.g., low-k dielectric or high-k dielectric) having different etch selectivity than the oxide layers 28A, 28B and the STI regions. In some embodiments, the first liner layer 410 has thickness in a range of about 1 nm to about 5 nm. Below about 1 nm, the thickness of the first liner layer 410 may not be sufficient to protect the oxide layers 28A, 28B. Above about 5 nm, the first liner layer 410 may consume too much space between the fin structures 26, which may degrade yield when forming the isolation regions 361-364 and/or the inactive fin structures 94.

Figure 5A:
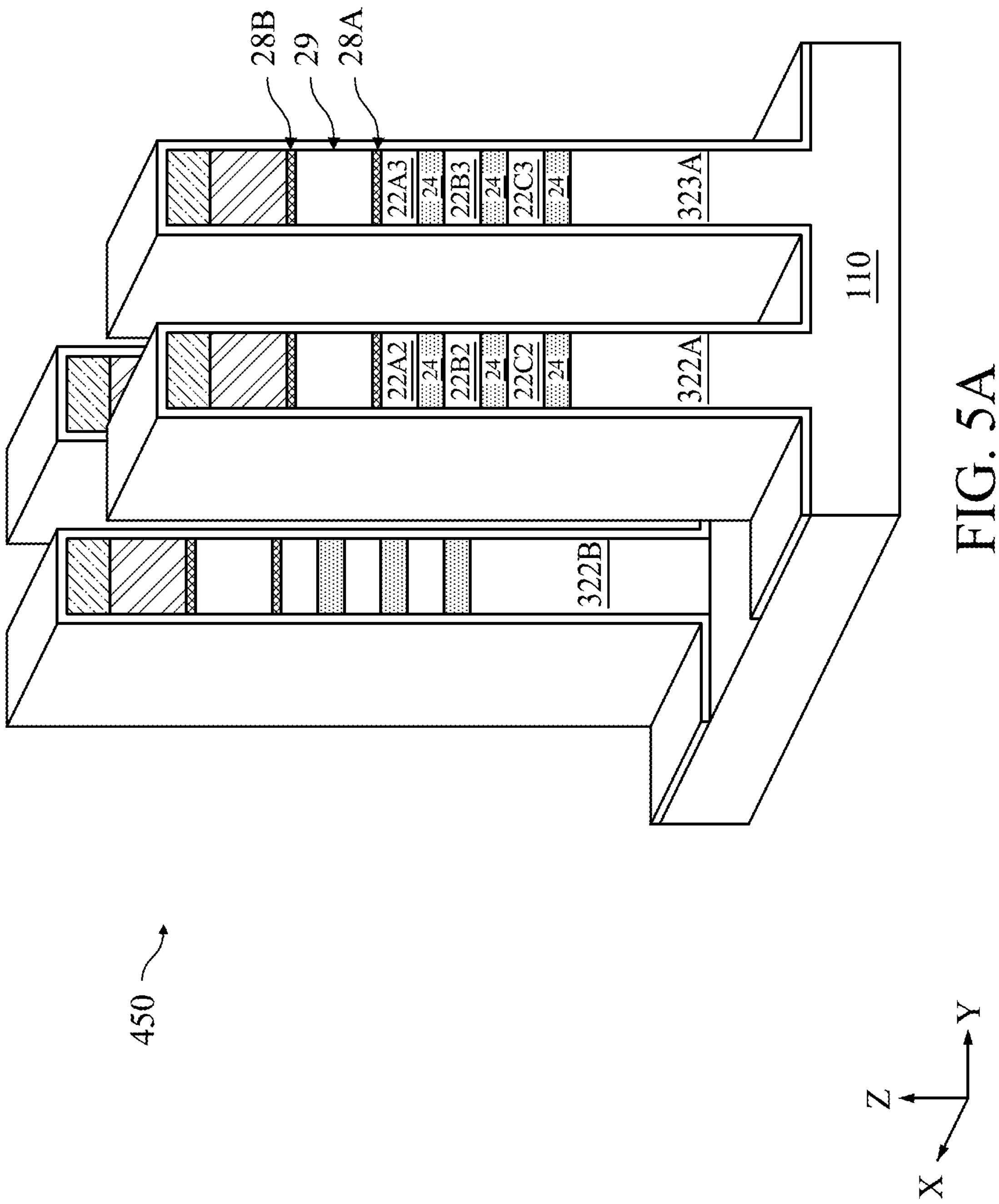
Figure 5B:
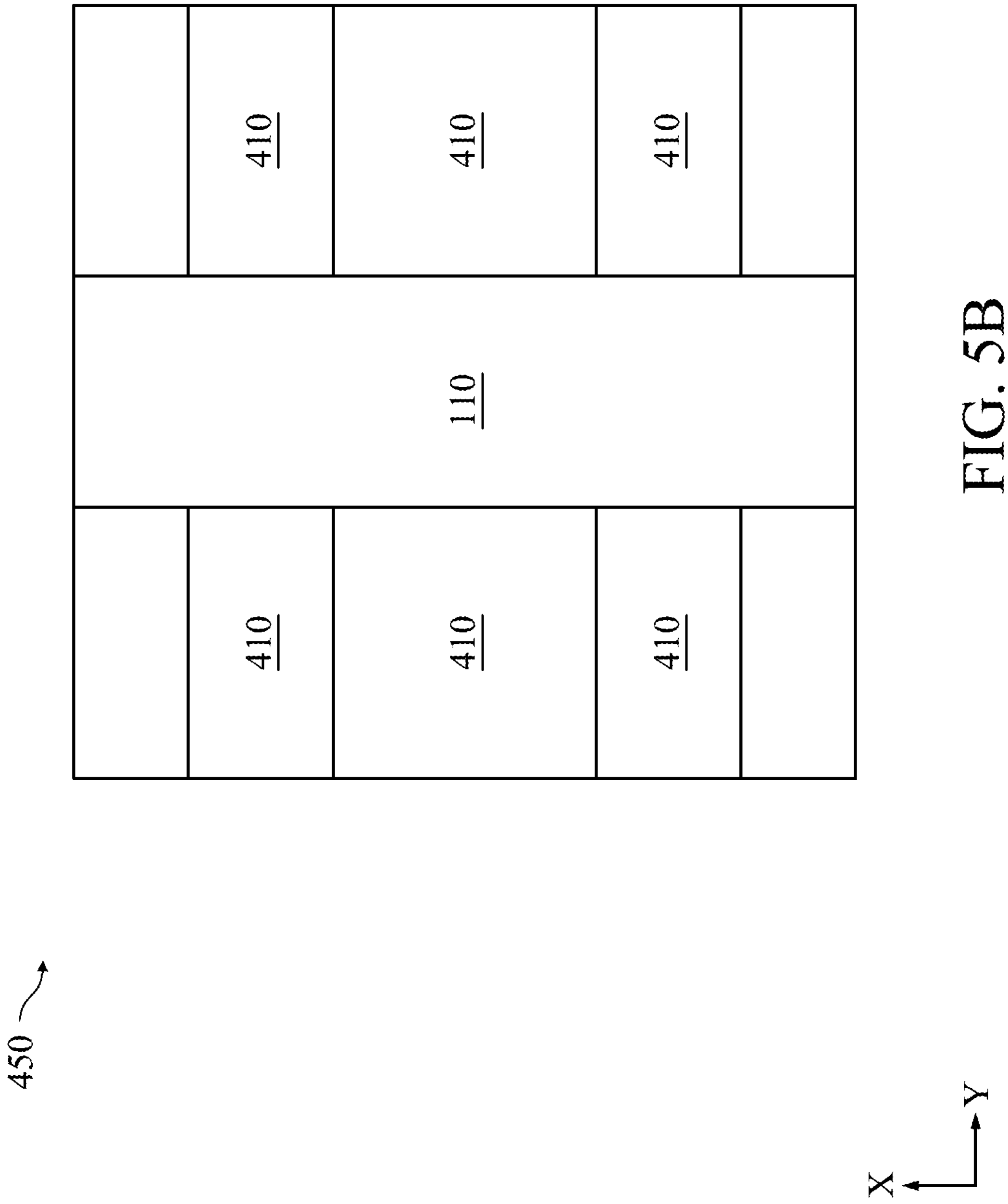

In FIG. 5A and FIG. 5B, cutting and cleaning processes are performed to trim the fins 321-325, corresponding to operation 1300 of FIG. 15A. A representative portion 450 (shown in another view by a dashed outline in FIG. 4) is illustrated in perspective view in FIGS. 5A and 5B. In the cutting process, which may include multiple etch operations, fin segments 322A, 322B, 323A shown are formed by removing portions of the first liner layer 410, the hard mask layers 29, 220, 230, the oxide layers 28A, 28B, the nanostructures 22, 24 and the fins 321-325. In subsequent figures, the fin segments 322A, 323A continue to be referred to as "fin 322" and "fin 323" for simplicity of illustration. In some embodiments, one or more masking layers are formed and patterned to expose the portions to be removed. The multiple etch operations may be performed on the exposed portions through the one or more masking layers. In some embodiments, a horizontal portion of the first liner layer 410 directly contacting the substrate 110 (e.g., between the fin segments 322A, 322B) is removed in the cutting process, as shown in FIG. 5B. Following the cutting process, one or more cleaning processes may be performed.

Figure 6A:
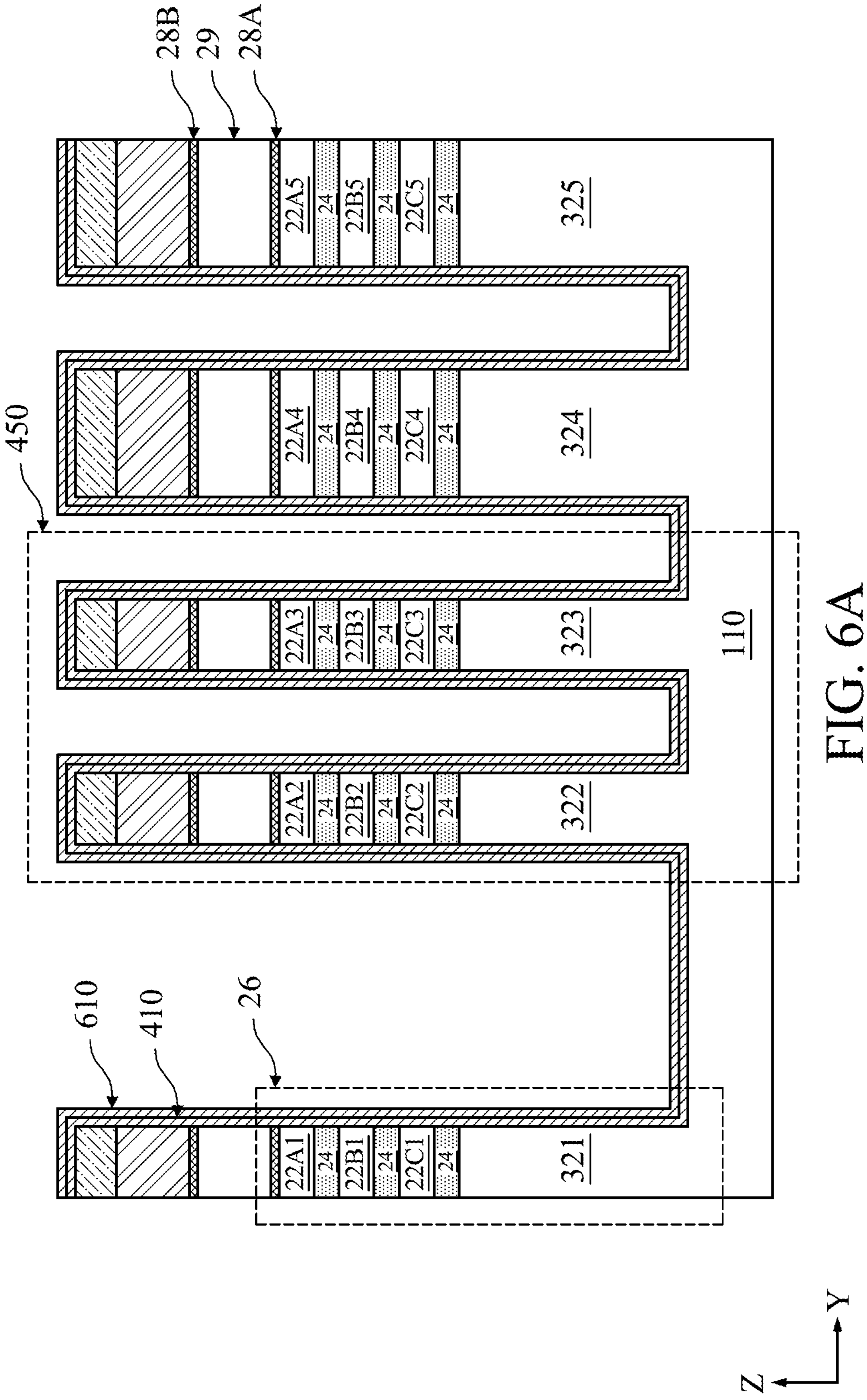
Figure 6B:
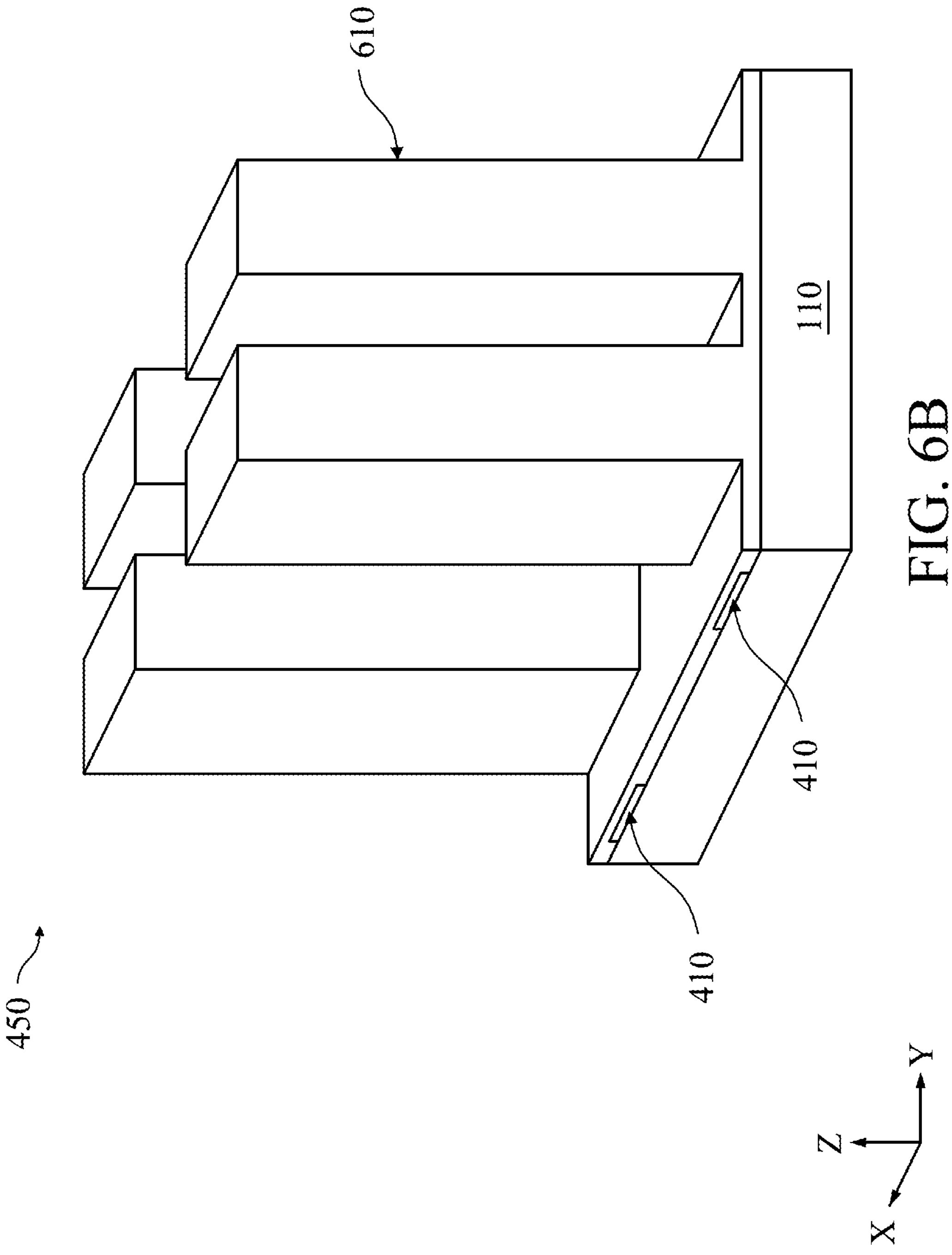
Figure 6C:
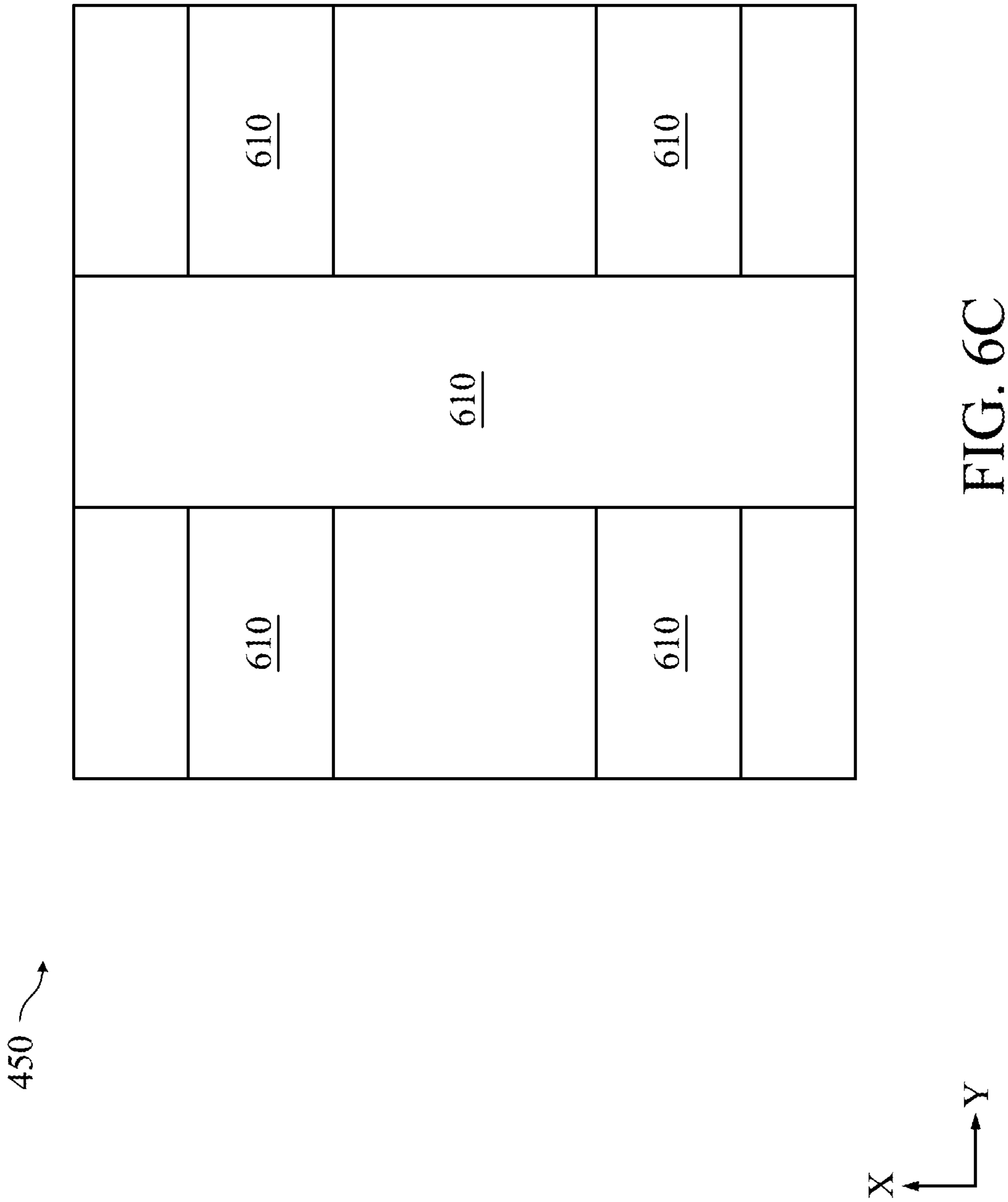

In FIG. 6A, FIG. 6B and FIG. 6C, a second liner layer 610 is formed over the first liner layer 410 and exposed portions of the substrate 110, corresponding to operation 1400 of FIG. 15A. The second liner layer 610 provides protection to the oxide layers 28A, 28B. Generally, the second liner layer 610 is formed of a material having different etch selectivity than the oxide layers 28A, 28B and the STI regions. In some embodiments, the second liner layer 610 is formed of silicon or silicon germanium. In some embodiments, the second liner layer 610 is formed of a silicon-based dielectric, such as SiC, SiN, SiCN, or other dielectric material (e.g., low-k dielectric or high-k dielectric) having different etch selectivity than the oxide layers 28A, 28B and the STI regions. In some embodiments, the first liner layer 410 and the second liner layer 610 have substantially the same material composition. Forming the first liner layer 410 and the second liner layer 610 of substantially the same material may provide one or more advantages, such as simplified processing (e.g., fewer transfers of the IC device 10 between processing chambers) and improved adhesion between the first and second liner layers 410, 610. In some embodiments, the second liner layer 610 is or includes a different material than the first liner layer 410, and the first and second liner layers 410, 610 are both formed of materials having different etch selectivity than the subsequently formed STI regions. Using different materials for the first and second liner layers 410, 610 may increase flexibility and/or tuning of protection provided, or may improve adhesion between the first and second liner layers 410, 610 and the fins 321-325 and the isolation features 361-364, respectively. In some embodiments, three or more liner layers are used, each having substantially the same material composition or one or more thereof having different material composition(s). FIG. 6B shows a perspective view of the portion 450, and FIG. 6C shows a top view of the portion 450. Referring to FIG. 6B, in the X-Z plane, the first liner layer 410 may be covered on three sides by the second liner layer 610, and may be in direct contact with the substrate 110 on a fourth side. In some embodiments, the second liner layer 610 has thickness in a range of about 1 nm to about 5 nm. Below about 1 nm, the thickness of the second liner layer 610 may not be sufficient to protect the oxide layers 28A, 28B. Above about 5 nm, the second liner layer 610 may consume too much space between the fin structures 26, which may degrade yield when forming the isolation regions 361-364 and/or the inactive fin structures 94. In some embodiments, total thickness of all liner layers between the fins 321-325 and respective isolation features 361-364 is greater than about 1 nm, and is less than about 15 nm, less than about 10 nm, or less than about 8 nm.

Figure 7A:
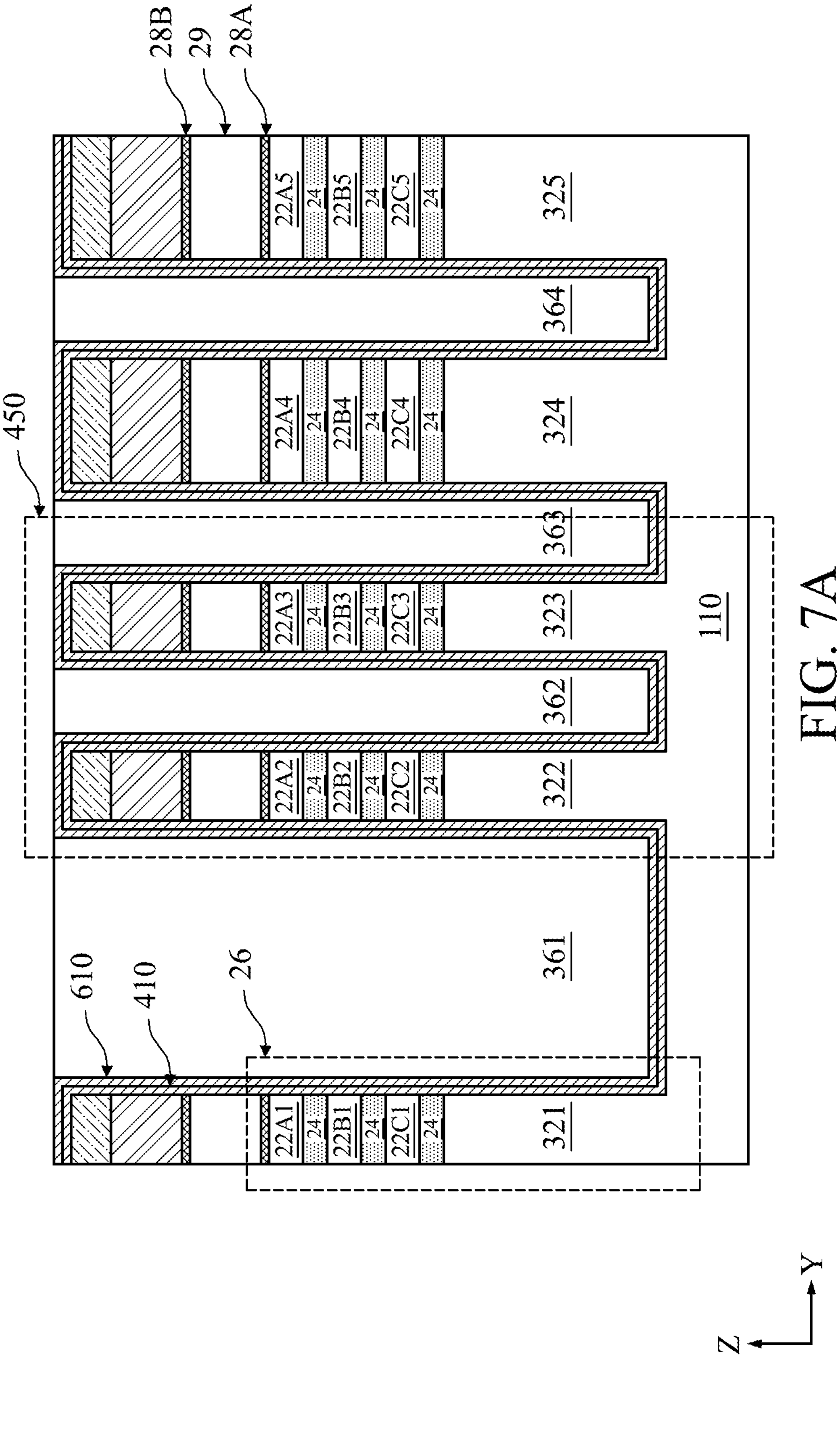
Figure 7B:
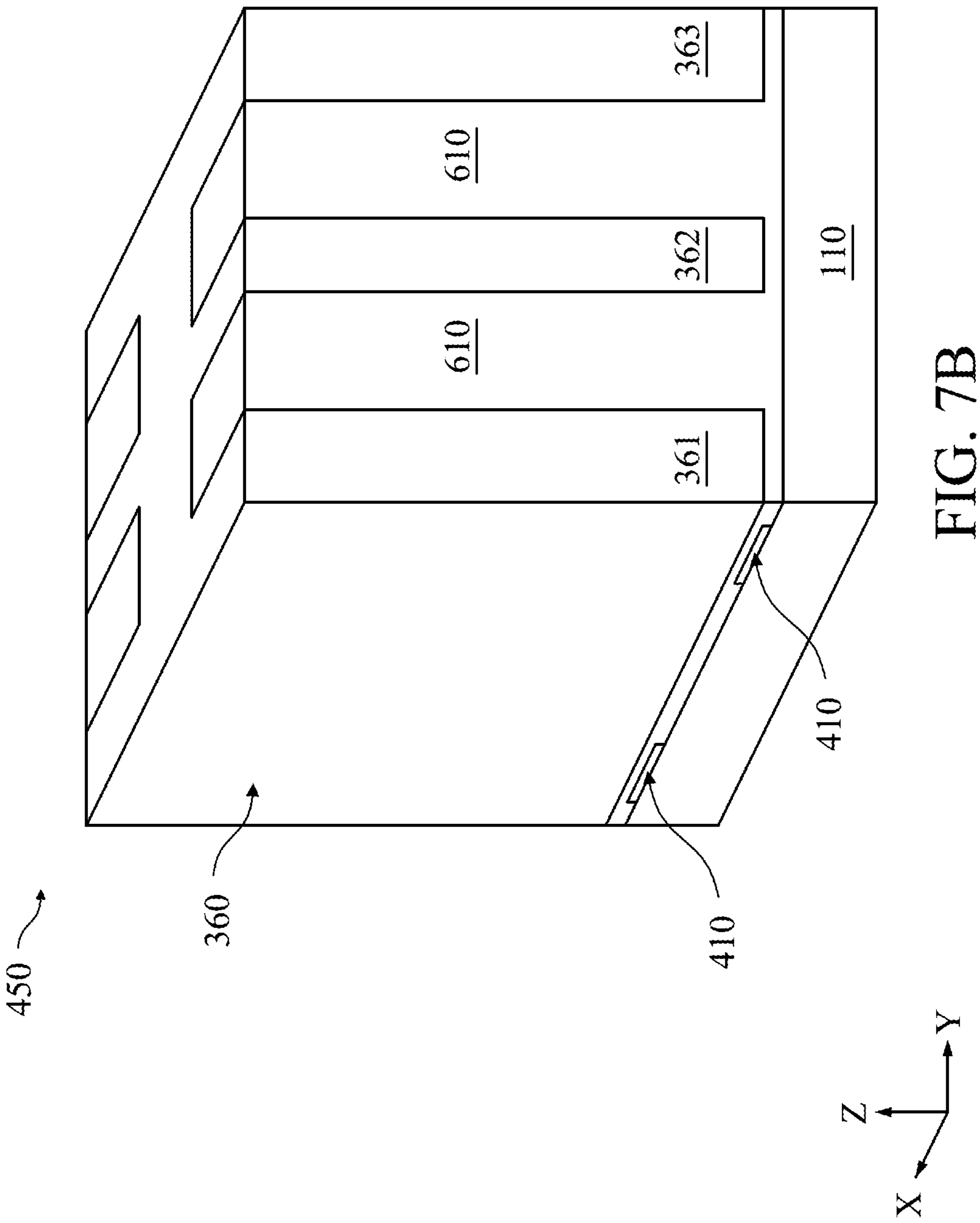

In FIG. 7A and FIG. 7B, isolation regions 361-364, which may be the STI regions described above, are formed adjacent and between the fins 321-325, corresponding to operation 1500 of FIG. 15A. The isolation regions 361-364 may be formed by depositing an insulation material layer 360 (see FIG. 7B) over the second liner layer 610 covering the substrate 110, the fins 321-325, and nanostructures 22, 24, and between adjacent fins 321-325 and nanostructures 22, 24. The insulation material layer 360 may be an oxide, such as silicon oxide, a nitride, the like, or a combination thereof, and may be formed by high-density plasma CVD (HDP-CVD), flowable CVD (FCVD), the like, or a combination thereof. In some embodiments, an additional liner (not separately illustrated) may first be formed along surfaces of the second liner layer 610 covering the substrate 110, the fins 321-325, and the nanostructures 22, 24. Thereafter, a fill material, such as those discussed above may be formed over the liner.

In some embodiments, the insulation material layer 360 undergoes a removal process, such as a chemical mechanical polish (CMP), an etch-back process, combinations thereof, or the like, to remove excess insulation material layer 360 over the nanostructures 22, 24. In some embodiments, top surfaces of the nanostructures 22, 24 may be exposed and level with the insulation material layer 360 after the removal process is complete. As shown in FIG. 7A, the insulation material layer 360 may remain over the nanostructures 22, 24.

Figure 8A:
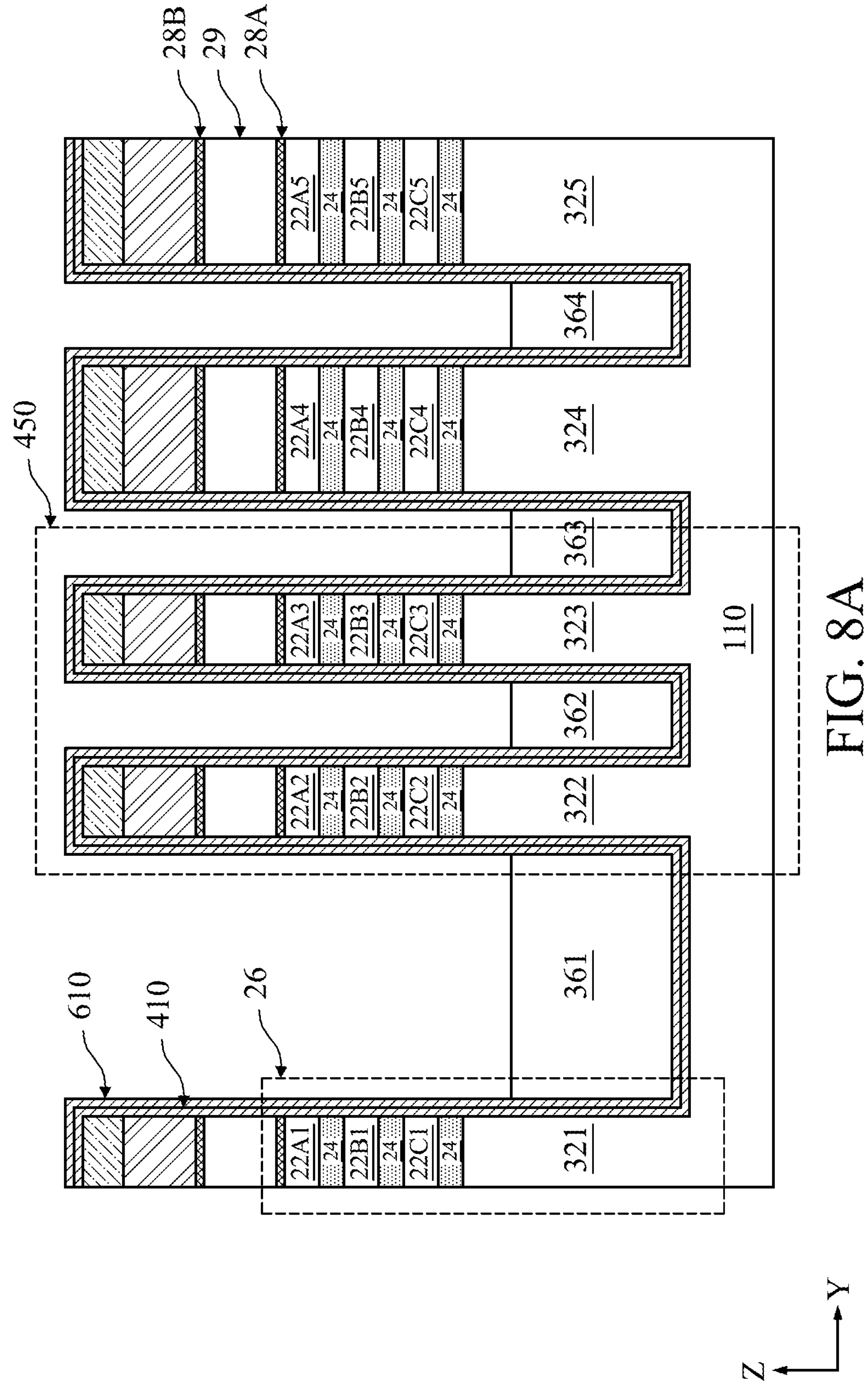
Figure 8B:
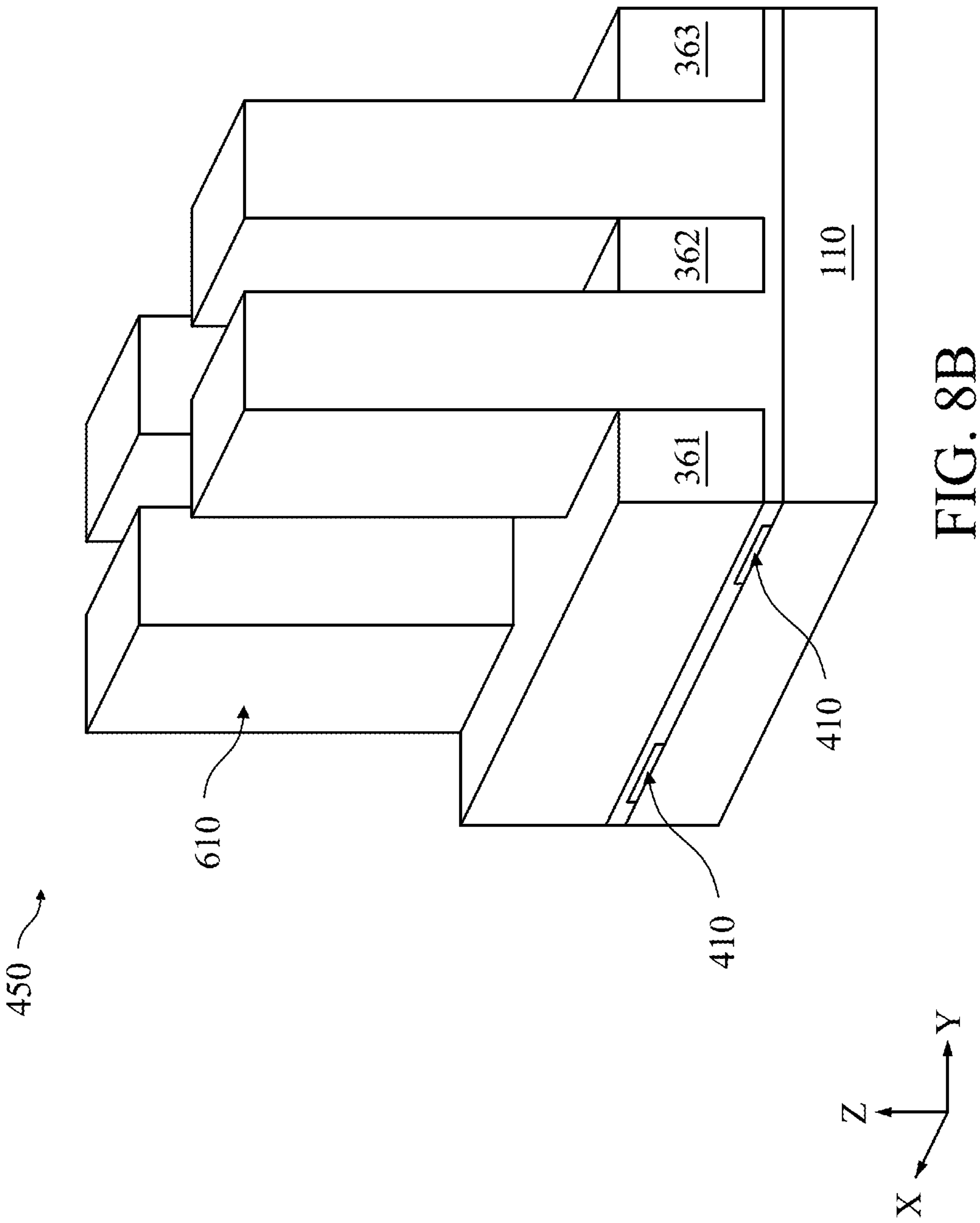

In FIG. 8A and FIG. 8B, the insulation material layer 360 is then recessed to form the isolation regions 361-364, corresponding to operation 1600 of FIG. 15A. After recessing the insulation material layer 360, the nanostructures 22, 24 and upper portions of the fins 321-325 may protrude from between neighboring isolation regions 361-364, and may still be covered by the first and second liner layers 410, 610. The isolation regions 361-364 may have top surfaces that are flat as illustrated, convex, concave, or a combination thereof. In some embodiments, the isolation regions 361-364 are recessed by an acceptable etching process, such as an oxide removal using, for example, dilute hydrofluoric acid (dHF), which is selective to the insulation material layer 360 and leaves the second liner layer 610 substantially unaltered. Due to the protective effect of the second liner layer 610, the oxide layers 28A, 28B are not damaged by the etching process, such as the oxide removal, used for recessing the isolation regions 361-364. As such, peeling of the hard mask layers 29, 220, 230 is reduced or eliminated, improving yield.

Further in FIG. 8A, appropriate wells (not separately illustrated) may be formed in the fins 321-325, the nanostructures 22, 24, and/or the isolation regions 361-364. Using masks, an n-type impurity implant may be performed in p-type regions of the substrate 110, and a p-type impurity implant may be performed in n-type regions of the substrate 110. Example n-type impurities may include phosphorus, arsenic, antimony, or the like. Example p-type impurities may include boron, boron fluoride, indium, or the like. An anneal may be performed after the implants to repair implant damage and to activate the p-type and/or n-type impurities. In some embodiments, in situ doping during epitaxial growth of the fins 321-325 and the nanostructures 22, 24 may obviate separate implantations, although in situ and implantation doping may be used together.

Figure 9A:
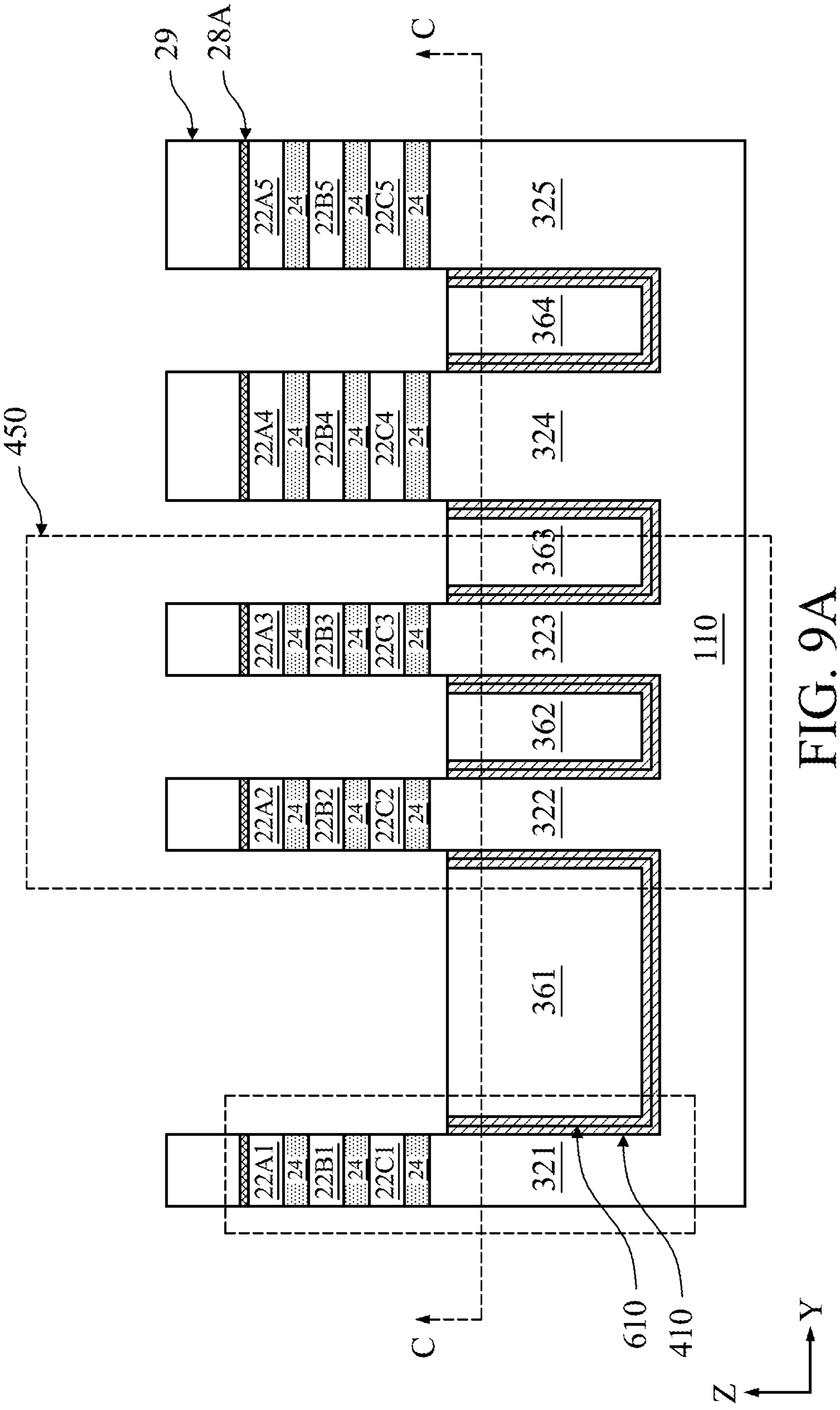
Figure 9B:
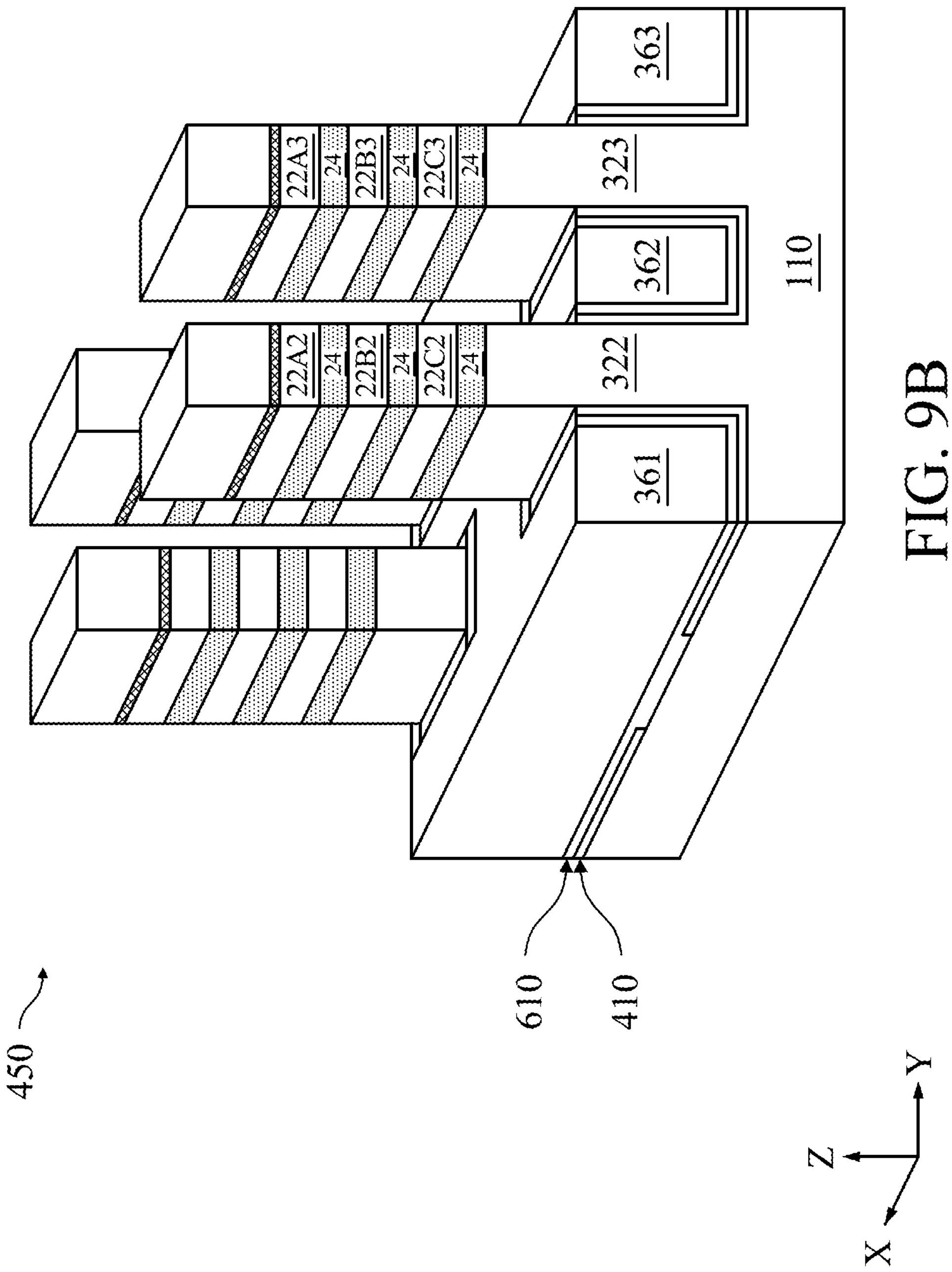
Figure 9C:
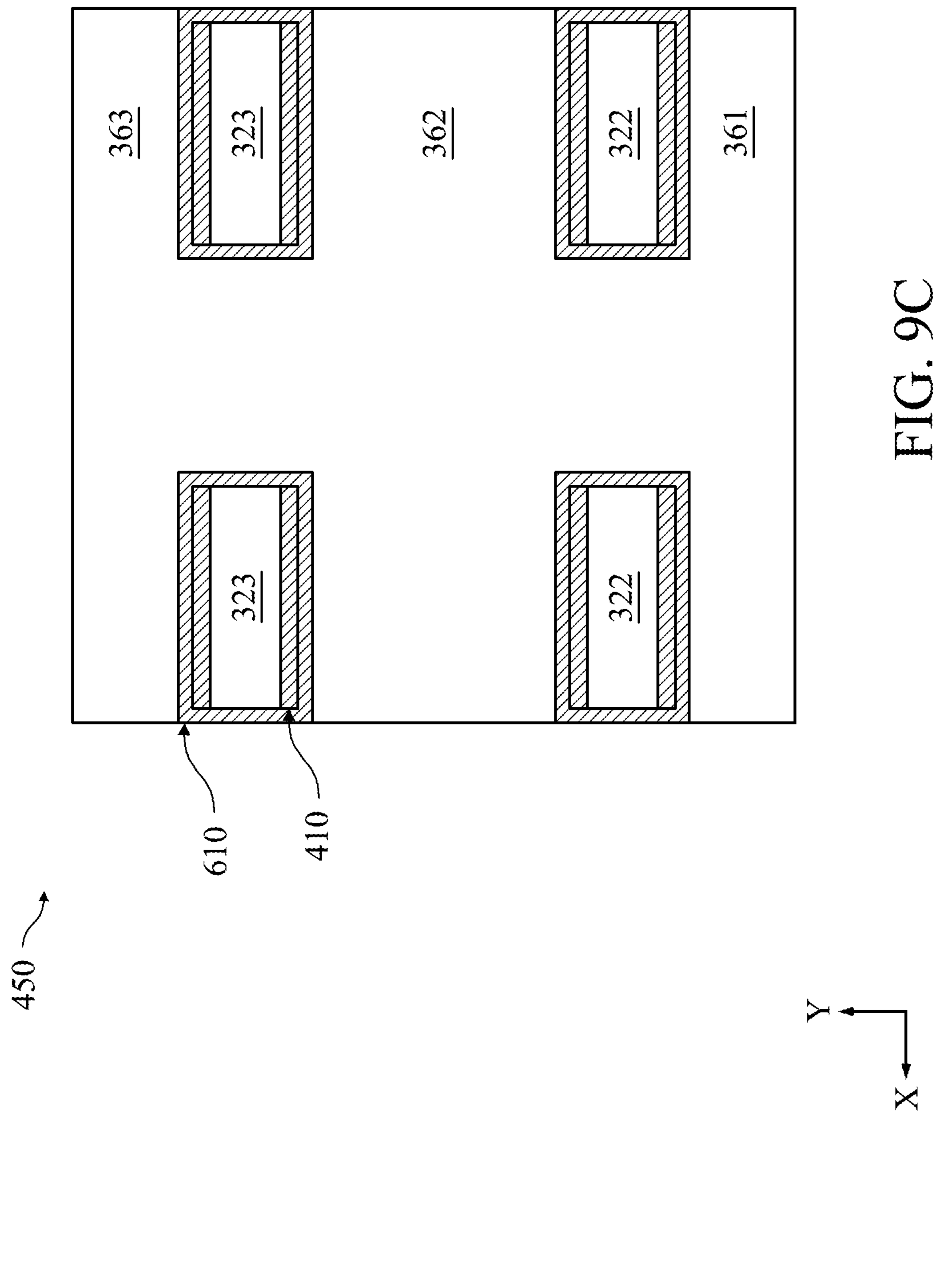

In FIG. 9A, FIG. 9B and FIG. 9C, the nanostructures 22, 24, the oxide layer 28A and the hard mask layer 29 are exposed by recessing the first and second liner layers 410, 610 and removing the hard mask layers 220, 230 and the oxide layer 29B, corresponding to operation 1700 in FIG. 15A. In some embodiments, the first and second liner layers 410, 610 are recessed to substantially the same level as the upper surfaces of the isolation features 361-364. In some embodiments, the recessing may result in upper surfaces of the first and second liner layers 410, 610 being below upper surfaces of the fins 321-325. The recessing may be performed by an etching operation selective to the material of the first and second liner layers 410, 610. Removal of the hard mask layers 220, 230 and the oxide layer 29B may be by chemical mechanical planarization (CMP), etching, or a similar process. Following recessing, portions of the first and second liner layers 410, 610 underlying and laterally surrounding the isolation regions 361-364 remain.

A detailed view of the first and second liner layers 410, 610 may be seen in FIG. 9C, which is a top view following recessing of the first and second liner layers 410, 610. The top view of FIG. 9C is a cross-sectional view parallel to the major surface of the substrate 110 taken through the isolation regions 361-365 as shown by the sectional line C-C in FIG. 9A. In some embodiments, the first liner layer 410 has substantially the same dimension in the X-direction as the fins 322, 323, and is in contact with the fins 322, 323 on two opposing sides of the fins 322, 323. The second liner layer 610 may laterally surround the first liner layer 410 and the fins 322, 323. First portions of the second liner layer 610 are in contact with sidewalls of the fins 322, 323, and second portions of the second liner layer 610 are in contact with the first liner layer 410.

Figure 10:
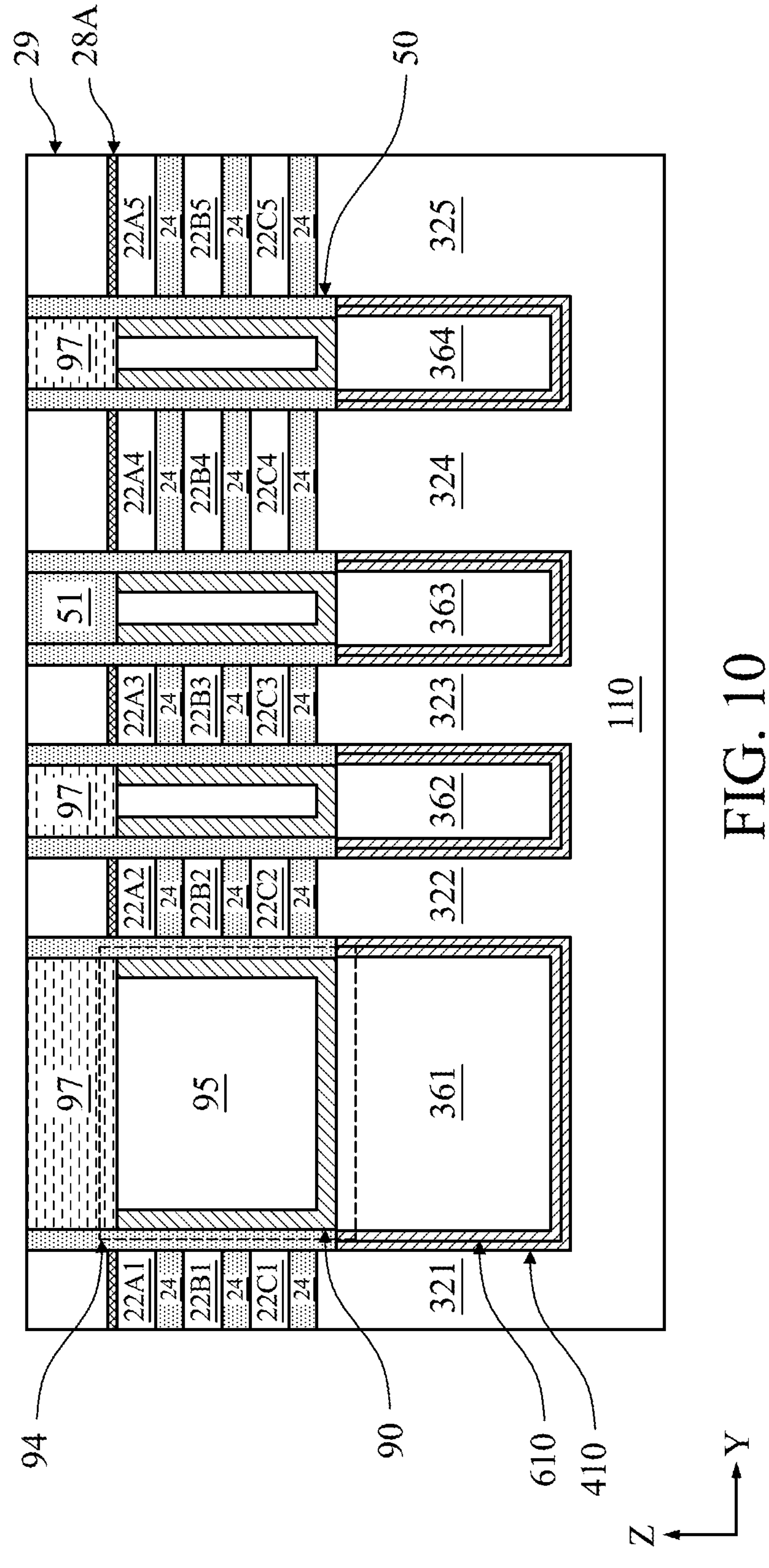

In FIG. 10, inactive fin structures 94, including liner layers 90 and fill layers 95, are formed by one or more fabrication operations, corresponding to operation 1800 of FIG. 15A. In some embodiments, a cladding layer 50 is formed on sidewalls of the fins 321-325, the nanostructures 22, 24, the oxide layer 28A, and the hard mask layer 29. The cladding layer 50 may be, for example, a SiGe layer formed conformally on the mentioned features. Following formation of the cladding layer 50, an etching process may be performed to remove horizontal portions of the cladding layer 50 overlying the isolation features 361-364. The liner layer 90 may be formed over the hard mask 29, the cladding layer 50, and the isolation features 361-364 using, for example, a self-aligning process. Following formation of the liner layer 90, the fill layer 95 may be formed over the liner layer 90 to fill in openings between the nanostructures 22, 24. Generally, the liner layer 90 and the fill layer 95 are formed such that excess portions overlie and extend above the upper surface of the hard mask layer 29. Following formation of the fill layer 95, a combination of planarization processes and etching processes may be used to remove the excess portions, then recess the liner layer 90 and the fill layer 95 to a level substantially even with top surfaces of the nanostructures 22A1, 22A2, 22A3, 22A4, 22A5.

In some embodiments, following recessing of the liner layer 90 and the fill layer 95, gate isolation features 97 may be formed overlying the inactive fin structures 94, corresponding to operation 1900 shown in FIG. 15B. The gate isolation features 97 may be formed of a suitable material, such as a high-k dielectric material, by a suitable process, such as a deposition process including PVD, CVD, ALD, or the like. One or more of the inactive fin structures 94 may not be capped by a gate isolation feature 97, so as to allow formation of an interconnected gate structure over two neighboring fin stacks 26. In some embodiments, a cladding cap 51 may be formed before or after formation of the gate isolation features 97. The cladding cap 51 may be formed of the same material as the cladding layer 50 and the nanostructures 24 to aid in removal of the cladding cap 51 during gate replacement, which is described with reference to FIG. 13A.

Figure 11:
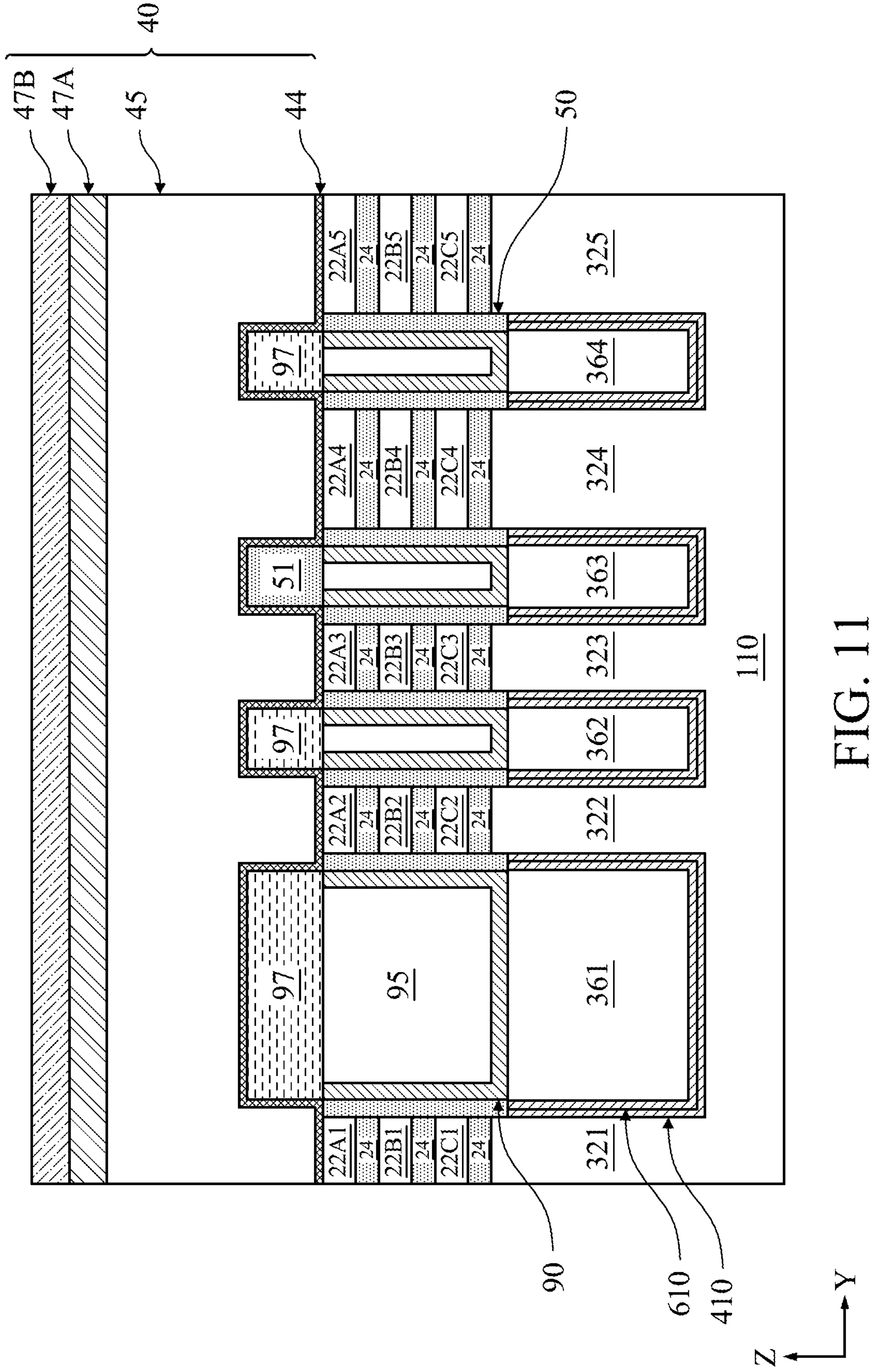

In FIG. 11, dummy gate structures 40 are formed over the fins 321-325 and/or the nanostructures 22, 24, corresponding to operation 2000 of FIG. 15B. A single dummy gate structure 40 is shown in FIG. 11, and many further dummy gate structures 40 may be formed substantially parallel and concurrently with the dummy gate structure 40 shown. In forming the dummy gate structure 40, a dummy gate layer 45 is formed over the fins 321-325 and/or the nanostructures 22, 24. The dummy gate layer 45 may be made of materials that have a high etching selectivity to the isolation regions 361-364. The dummy gate layer 45 may be a conductive, semiconductive, or non-conductive material and may be selected from a group including amorphous silicon, polycrystalline-silicon (polysilicon), poly-crystalline silicon-germanium (poly-SiGe), metallic nitrides, metallic silicides, metallic oxides, and metals. The dummy gate layer 45 may be deposited by physical vapor deposition (PVD), CVD, sputter deposition, or other techniques for depositing the selected material. A mask layer 47, including lower mask layer 47A and upper mask layer 47B, is formed over the dummy gate layer 45, and may include, for example, silicon nitride, silicon oxynitride, or the like. As shown in FIG. 11, the mask layer 47 includes the lower mask layer 47A directly contacting the dummy gate layer 45, and the upper mask layer 47B directly contacting the lower mask layer 47A. In some embodiments, as shown, a gate dielectric layer 44 is present between the dummy gate layer 45 and the fins 321-325 and/or the nanostructures 22, 24.

Figure 12A:
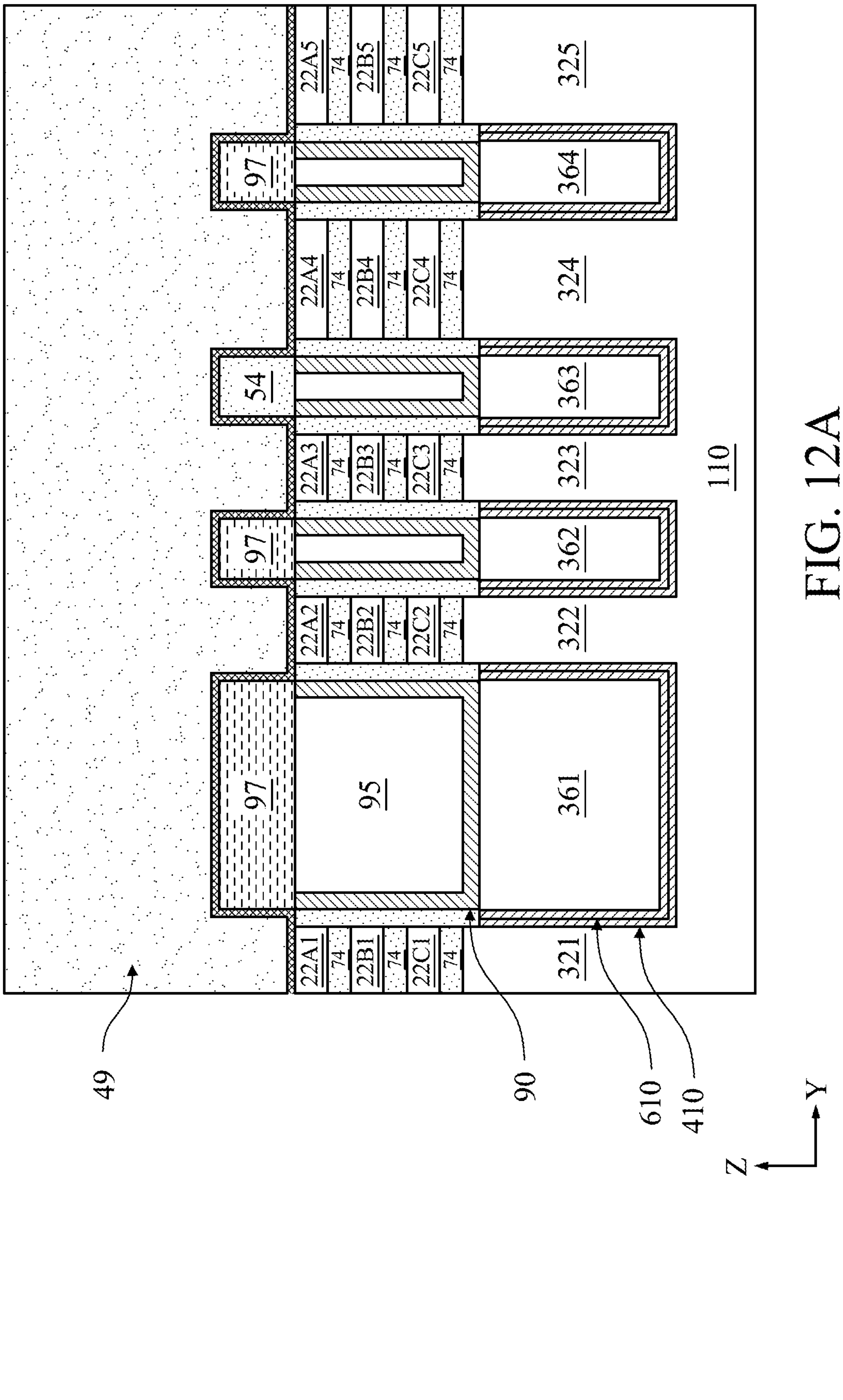

In FIG. 12A, a spacer layer 49 is formed over the mask layer(s) 47, the dummy gate layer 45, the gate dielectric layer 44, the hard mask layer 29, the oxide layer 28A, the nanostructures 22, 24, the inactive fins 94, the gate isolation features 97, the cladding cap 51 and the isolation regions 361-364, e.g., by a conformal deposition process. The spacer layer 49 is or comprises an insulating material, such as silicon nitride, silicon oxide, silicon carbo-nitride, silicon oxynitride, silicon oxy carbo-nitride, amorphous silicon, or the like. Following deposition of the spacer layer 49, horizontal (X-Y plane) surfaces of the spacer layer 49 are removed, then one or more etching processes are performed to etch the portions of protruding fins 321-325 and/or nanostructures 22, 24 that are not covered by dummy gate structures 40 and the spacer layer 49. The etching may be anisotropic, such that the portions of fins 321-325 directly underlying dummy gate structures 40 and the spacer layer 49 are protected, and are not etched. The top surfaces of the recessed fins 321-325 may be substantially coplanar with the top surfaces of the isolation regions 361-364, or slightly above the top surfaces of the isolation regions 361-364, as shown in FIG. 12A, in accordance with some embodiments. The etching leaves the gate isolation features 97 substantially intact.

Following the etching, inner spacers 74 are formed, corresponding to operation 2100 of FIG. 15B. A selective etching process is performed to recess exposed end portions of the nanostructures 24 without substantially attacking the nanostructures 22. After the selective etching process, recesses are formed in the nanostructures 24 at locations where the removed end portions used to be. Next, an inner spacer layer is formed to fill the recesses between the nanostructures 22 formed by the previous selective etching process. The inner spacer layer may be a suitable dielectric material, such as silicon carbon nitride (SiCN), silicon oxycarbonitride (SiOCN), or the like, formed by a suitable deposition method such as PVD, CVD, ALD, or the like. An etching process, such as an anisotropic etching process, is performed to remove portions of the inner spacer layers disposed outside the recesses in the nanostructures 24. The remaining portions of the inner spacer layers (e.g., portions disposed inside the recesses in the nanostructures 24) form the inner spacers 74. During etching of the nanostructures 24, the cladding cap 51 may be recessed, as well, such that a capping spacer 54 is formed following deposition and etch back of the inner spacer layer. The resulting structure is shown in FIG. 12A.

Figure 12B:
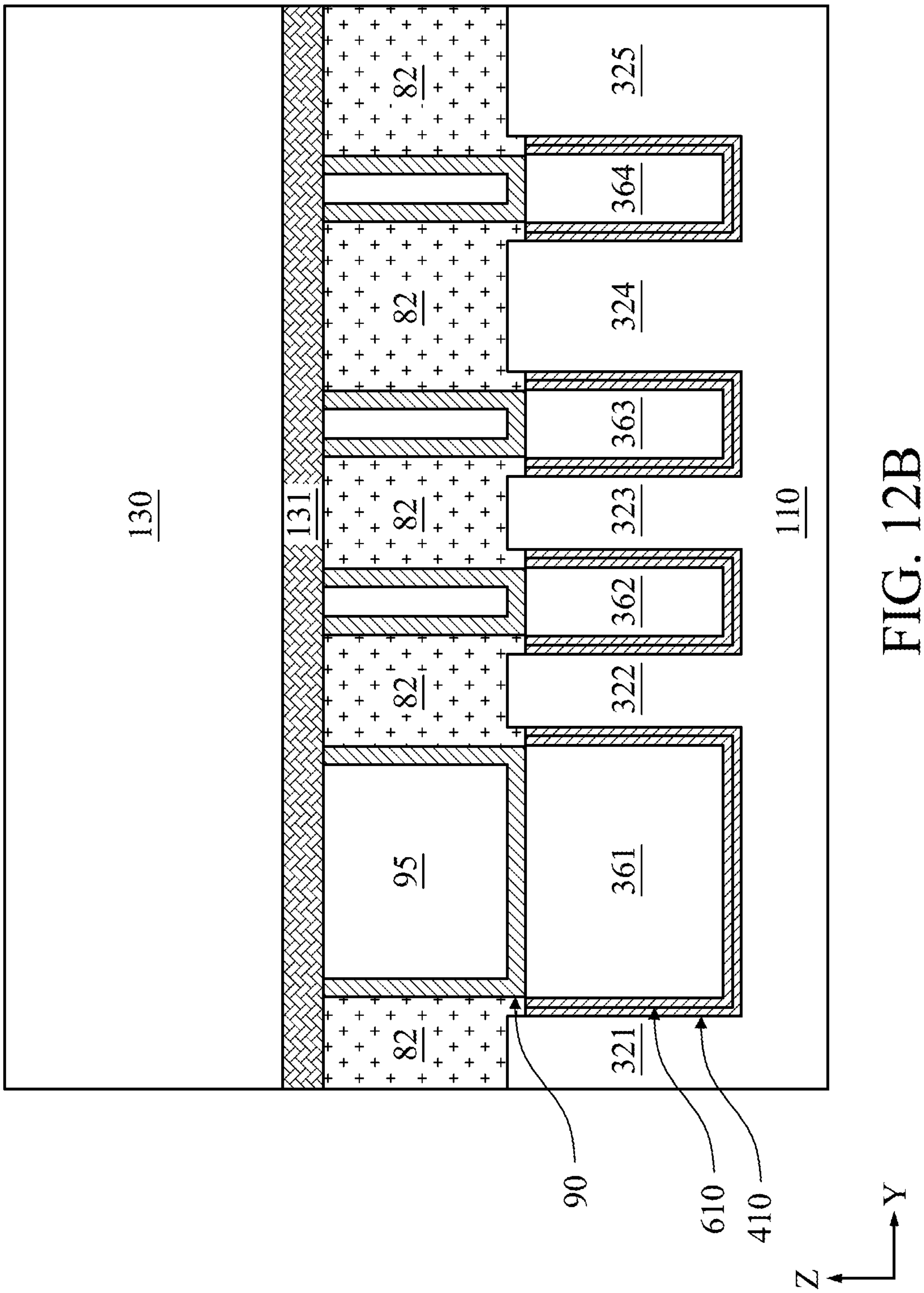

FIG. 12B illustrates formation of the source/drain regions 82 between the inactive fins 94, corresponding to operation 2200 of FIG. 15B. In the illustrated embodiment, the source/drain regions 82 are epitaxially grown from epitaxial material(s). In some embodiments, due to reduced spacing between the inactive fins 94, the source/drain regions 82 are grown substantially without lateral growth. In some embodiments, the source/drain regions 82 exert stress in the respective channels 22A1-22C5, thereby improving performance. The source/drain regions 82 are formed such that the dummy gate structure 40 is disposed between respective neighboring pairs of the source/drain regions 82, for example, along the X-direction. In some embodiments, the spacer layer 49 and the inner spacers 74, separate the source/drain regions 82 from the dummy gate layer 45 by an appropriate lateral distance to prevent electrical bridging to subsequently formed gates of the resulting device.

The source/drain regions 82 may include any acceptable material, such as appropriate for n-type or p-type devices. For n-type devices, the source/drain regions 82 include materials exerting a tensile strain in the channel regions, such as silicon, SiC, SiCP, SiP, or the like, in some embodiments. When p-type devices are formed, the source/drain regions 82 include materials exerting a compressive strain in the channel regions, such as SiGe, SiGeB, Ge, GeSn, or the like, in accordance with certain embodiments. The source/drain regions 82 may have surfaces raised from respective surfaces of the fins and may have facets. Neighboring source/drain regions 82 may merge in some embodiments to form a singular source/drain region 82 adjacent two neighboring fins 321-325.

The source/drain regions 82 may be implanted with dopants followed by an anneal. The source/drain regions may have an impurity concentration of between about $10^{19}$ $cm^{-3}$ and about $10^{21}$ $cm^{-3}$. N-type and/or p-type impurities for source/drain regions 82 may be any of the impurities previously discussed. In some embodiments, the source/drain regions 82 are in situ doped during growth.

A contact etch stop layer (CESL) 131 and interlayer dielectric (ILD) 130 may then be formed covering the source/drain regions 82. Prior to removal of the nanostructures 24, the mask layer 47, and the dummy gate layer 45 (described with reference to FIG. 11), the ILD 130 is deposited over the source/drain features 82 and the inactive fins 94. The etch stop layer 131 may be formed prior to deposition of the ILD 130. Following deposition of the ILD 130, the ILD 130 may be recessed slightly, and a second etch stop layer (not shown in the figures) may be formed over the ILD 130 in the recess. A CMP operation or the like may then be performed to remove excess material of the second etch stop layer, such that an upper surface of the second etch stop layer is substantially planar with upper surfaces of the etch stop layer 131 and the gate spacers 49.

Figure 13A:
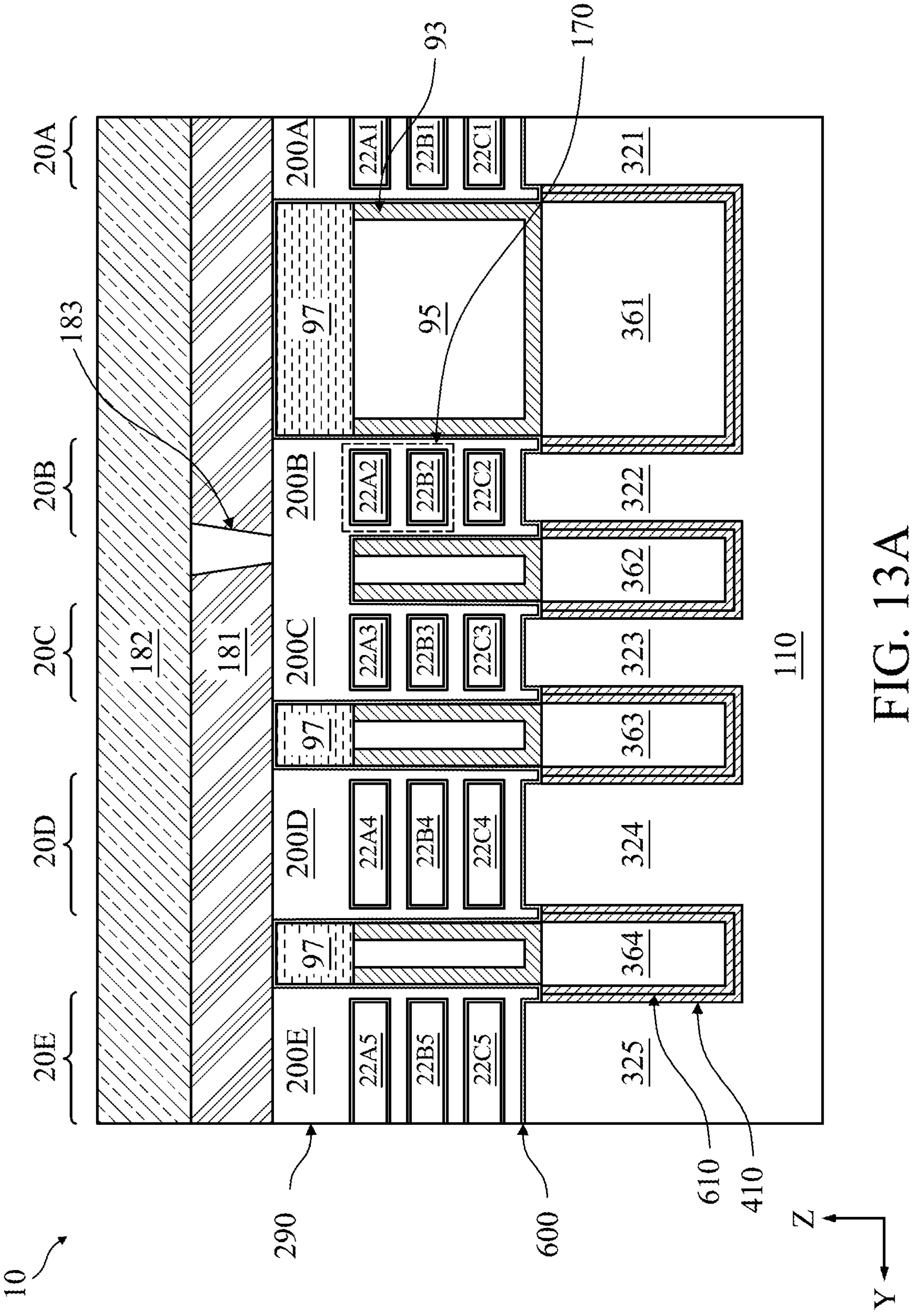

In FIG. 13A, fin channels 22A1-22C5 are released by removal of the nanostructures 24, the mask layer 47, the dummy gate layer 45 and the cladding cap 51, and replacement gate structures 200A-200E are formed, which corresponds to operation 2300 of FIG. 15B. Prior to release, a planarization process, such as a CMP, is performed to level the top surfaces of the dummy gate layer 45, the gate spacer layer 49, the CESL 131 and the ILD 130. The planarization process may also remove the mask layer 47 on the dummy gate layer 45, and portions of the gate spacer layer 49 along sidewalls of the mask layer 47. Accordingly, the top surfaces of the dummy gate layer 45 are exposed.

Next, the dummy gate layer 45 is removed in an etching process, so that recesses are formed. In some embodiments, the dummy gate layer 45 is removed by an anisotropic dry etch process. For example, the etching process may include a dry etch process using reaction gas(es) that selectively etch the dummy gate layer 45 without etching the spacer layer 49. The dummy gate dielectric 44, when present, may be used as an etch stop layer when the dummy gate layer 45 is etched. The dummy gate dielectric 44 may then be removed after the removal of the dummy gate layer 45.

The nanostructures 24 and the cladding cap 51 are removed to release the nanostructures 22. After the nanostructures 24 and the cladding cap 51 are removed, the nanostructures 22 form a plurality of nanosheets that extend horizontally (e.g., parallel to a major upper surface of the substrate 110). The nanosheets may be collectively referred to as the channels 22 of the GAA devices 20A-20E formed.

In some embodiments, the nanostructures 24 are removed by a selective etching process using an etchant that is selective to the material of the nanostructures 24, such that the nanostructures 24 are removed without substantially attacking the nanostructures 22. In some embodiments, the etching process is an isotropic etching process using an etching gas, and optionally, a carrier gas, where the etching gas comprises F2 and HF, and the carrier gas may be an inert gas such as Ar, He, N2, combinations thereof, or the like.

In some embodiments, the nanostructures 24 are removed and the nanostructures 22 are patterned to form channel regions of both PFETs and NFETs. In some other embodiments, the nanostructures 22 may be removed and the nanostructures 24 may be patterned to form channel regions of both PFETs and NFETs.

In some embodiments, the nanosheets 22 of the GAA devices 20A-20E are reshaped (e.g. thinned) by a further etching process to improve gate fill window. The reshaping may be performed by an isotropic etching process selective to the nanosheets 22. After reshaping, the nanosheets 22 may exhibit the dog bone shape in which middle portions of the nanosheets 22 are thinner than peripheral portions of the nanosheets 22 along the X direction.

Replacement gates 200, such as the gate structures 200A-200E, are formed. FIG. 14 is a detailed view of the region 170 of FIG. 13A corresponding to a portion of the gate structure 200B. Each replacement gate 200, as illustrated by the gate structure 200B in FIG. 14, generally includes the interfacial layer (IL, or "first IL" below) 210, at least one gate dielectric layer 600, the work function metal layer 900, and the gate fill layer 290. In some embodiments, each replacement gate 200 further includes at least one of a second interfacial layer 240 or a second work function layer 700.

With reference to FIG. 14, in some embodiments, the first IL 210 includes an oxide of the semiconductor material of the substrate 110, e.g. silicon oxide. In other embodiments, the first IL 210 may include another suitable type of dielectric material. The first IL 210 has a thickness in a range between about 5 angstroms and about 50 angstroms.

Still referring to FIG. 14, the gate dielectric layer 600 is formed over the first IL 210. In some embodiments, an atomic layer deposition (ALD) process is used to form the gate dielectric layer 600 to control thickness of the deposited gate dielectric layer 600 with precision. In some embodiments, the ALD process is performed using between about 40 and 80 deposition cycles, at a temperature range between about 200 degrees Celsius and about 300 degrees Celsius. In some embodiments, the ALD process uses HfCl4 and/or H2O as precursors. Such an ALD process may form the gate dielectric layer 600 to have a thickness in a range between about 10 angstroms and about 100 angstroms.

In some embodiments, the gate dielectric layer 600 includes a high-k dielectric material, which may refer to dielectric materials having a high dielectric constant that is greater than a dielectric constant of silicon oxide (k≈3.9). Exemplary high-k dielectric materials include $HfO_2$, HfSiO, HfSiON, HfTaO, HfTiO, HfZrO, $ZrO_2$, $Ta_2O_5$, or combinations thereof. In other embodiments, the gate dielectric layer 600 may include a non-high-k dielectric material such as silicon oxide. In some embodiments, the gate dielectric layer 600 includes more than one high-k dielectric layer, of which at least one includes dopants, such as lanthanum, magnesium, yttrium, or the like, which may be driven in by an annealing process to modify threshold voltage of the GAA device 20B.

With further reference to FIG. 14, the second IL 240 is formed on the gate dielectric layer 600, and the second work function layer 700 is formed on the second IL 240. The second IL 240 promotes better metal gate adhesion on the gate dielectric layer 600. In many embodiments, the second IL 240 further provides improved thermal stability for the gate structure 200B, and serves to limit diffusion of metallic impurity from the work function metal layer 900 and/or the work function barrier layer 700 into the gate dielectric layer 600. In some embodiments, formation of the second IL 240 is accomplished by first depositing a high-k capping layer (not illustrated for simplicity) on the gate dielectric layer 600. The high-k capping layer comprises one or more of the following: HfSiON, HfTaO, HfTiO, HfTaO, HfAlON, HfZrO, or other suitable materials, in various embodiments. In a specific embodiment, the high-k capping layer comprises titanium silicon nitride (TiSiN). In some embodiments, the high-k capping layer is deposited by an ALD using about 40 to about 100 cycles at a temperature of about 400 degrees C. to about 450 degrees C. A thermal anneal is then performed to form the second IL 240, which may be or comprise TiSiNO, in some embodiments. Following formation of the second IL 240 by thermal anneal, an atomic layer etch (ALE) with artificial intelligence (AI) control may be performed in cycles to remove the high-k capping layer while substantially not removing the second IL 240. Each cycle may include a first pulse of $WCl_5$, followed by an Ar purge, followed by a second pulse of $O_2$, followed by another Ar purge. The high-k capping layer is removed to increase gate fill window for further multiple threshold voltage tuning by metal gate patterning.

Further in FIG. 14, after forming the second IL 240 and removing the high-k capping layer, the work function barrier layer 700 is optionally formed on the gate structure 200B, in accordance with some embodiments. The work function barrier layer 700 is or comprises a metal nitride, such as TiN, WN, MoN, TaN, or the like. In a specific embodiment, the work function barrier layer 700 is TiN. The work function barrier layer 700 may have thickness ranging from about 5 A to about 20 A. Inclusion of the work function barrier layer 700 provides additional threshold voltage tuning flexibility. In general, the work function barrier layer 700 increases the threshold voltage for NFET transistor devices, and decreases the threshold voltage (magnitude) for PFET transistor devices.

The work function metal layer 900, which may include at least one of an N-type work function metal layer, an in-situ capping layer, or an oxygen blocking layer, is formed on the work function barrier layer 700, in some embodiments. The N-type work function metal layer is or comprises an N-type metal material, such as TiAlC, TiAl, TaAlC, TaAl, or the like. The N-type work function metal layer may be formed by one or more deposition methods, such as CVD, PVD, ALD, plating, and/or other suitable methods, and has a thickness between about 10 A and 20 A. The in-situ capping layer is formed on the N-type work function metal layer. In some embodiments, the in-situ capping layer is or comprises TiN, TiSiN, TaN, or another suitable material, and has a thickness between about 10 A and 20 A. The oxygen blocking layer is formed on the in-situ capping layer to prevent oxygen diffusion into the N-type work function metal layer, which would cause an undesirable shift in the threshold voltage. The oxygen blocking layer is formed of a dielectric material that can stop oxygen from penetrating to the N-type work function metal layer, and may protect the N-type work function metal layer from further oxidation. The oxygen blocking layer may include an oxide of silicon, germanium, SiGe, or another suitable material. In some embodiments, the oxygen blocking layer is formed using ALD and has a thickness between about 10 A and about 20 A.

FIG. 14 further illustrates the metal fill layer 290. In some embodiments, a glue layer (not separately illustrated) is formed between the oxygen blocking layer of the work function metal layer and the metal fill layer 290. The glue layer may promote and/or enhance the adhesion between the metal fill layer 290 and the work function metal layer 900. In some embodiments, the glue layer may be formed of a metal nitride, such as TiN, TaN, MoN, WN, or another suitable material, using ALD. In some embodiments, thickness of the glue layer is between about 10 A and about 25 A. The metal fill layer 290 may be formed on the glue layer, and may include a conductive material such as tungsten, cobalt, ruthenium, iridium, molybdenum, copper, aluminum, or combinations thereof. In some embodiments, the metal fill layer 290 may be deposited using methods such as CVD, PVD, plating, and/or other suitable processes. In some embodiments, a seam 510, which may be an air gap, is formed in the metal fill layer 290 vertically between the channels 22A2, 22B2. In some embodiments, the metal fill layer 290 is conformally deposited on the work function metal layer 900. The seam 510 may form due to sidewall deposited film merging during the conformal deposition. In some embodiments, the seam 510 is not present between the neighboring channels 22A2, 22B2.

As shown in FIG. 13A, the gate structures 200C, 200D are electrically connected to each other due to absence of any gate isolation structure 97. Following formation of the gate structures 200, one or more dielectric layers 181 may be formed over the gate structures 200, followed by formation of one or more conductive layers 182. In FIG. 13A, the conductive layer 182 may be or comprise a metal trace or wire extending in the Y-direction. The conductive layer 182 may be electrically connected to one or more of the metal gates 200 by a conductive plug 183. For example, as shown in FIG. 13A, the conductive plug 183 extends from the conductive layer 182 to an upper surface of the gate structures 200B, 200C.

Figure 13B:
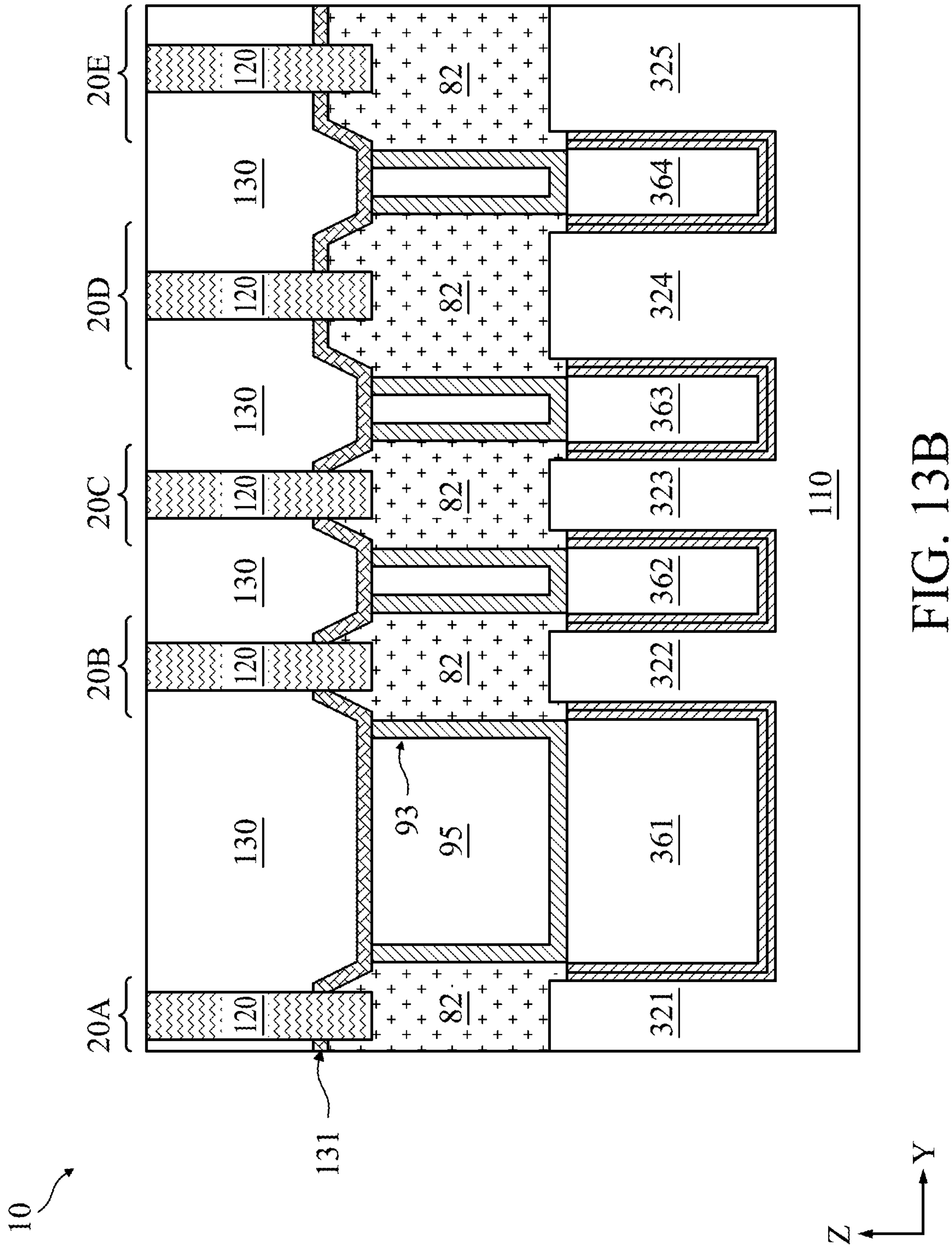

In FIG. 13B, source/drain contacts 120 are formed through the ILD 130, the etch stop layer 131, and contacting the source/drain features 82. In some embodiments, an etch process is performed to form openings in the ILD 130, then another etch process is performed to extend the openings through the etch stop layer 131 and expose upper surfaces of the source/drain features 82. In some embodiments, the metal silicide layer 118 (not shown in FIG. 13B for simplicity) is formed at the upper surface of each source/drain feature 82 exposed. The source/drain contacts 120 are then formed by depositing conductive material in the openings over the source/drain features 82. In some embodiments, the conductive material is or includes copper, tungsten, ruthenium, cobalt, or another suitable material. In some embodiments, the conductive material is deposited by PVD, electroless plating, or another suitable process. Following deposition of the conductive material in the openings, a removal process, such as CMP, may be performed to remove excess conductive material on the ILD 130, such that upper surfaces of the source/drain contacts 120 are substantially level with the upper surface of the ILD 130.

Additional processing may be performed to finish fabrication of the GAA devices 20A-20E. An interconnect structure may be formed over the source/drain contacts 120 and the gate contacts 183. The interconnect structure may include a plurality of dielectric layers surrounding metallic features, including conductive traces and conductive vias, which form electrical connection between devices on the substrate 110, such as the GAA devices 20A-20E, as well as to IC devices external to the IC device 10.

Embodiments may provide advantages. By forming the first and second liner layers 410, 610 prior to recessing the isolation features 361-365, the oxide layer 28A and/or the oxide layer 28B is protected, which prevents peeling of the hard mask layer 29. As such, better yield may be achieved when forming the IC device 10 using the first and second liner layers 410, 610 and the process 1000 described.

In accordance with at least one embodiment, a device includes a substrate, a first semiconductor channel over the substrate, a second semiconductor channel over the substrate and laterally offset from the first semiconductor channel, an isolation feature embedded in the substrate and laterally between the first and second semiconductor channels, a first liner layer laterally surrounding the isolation feature between the isolation feature and the first semiconductor channel, and a second liner layer laterally surrounding the first liner layer between the first liner layer and the first semiconductor channel.

In accordance with at least one embodiment, a device comprises a substrate, a first isolation region in the substrate and a second isolation region in the substrate and laterally offset from the first isolation region in a first direction. A first inactive fin structure is on the first isolation region. A second inactive fin structure is on the second isolation region. A vertical transistor is between the first isolation region and the second isolation region. A first liner layer is in contact with a semiconductor fin of the vertical transistor and the substrate. The first liner layer and the first isolation region include different material compositions. A second liner layer is in contact with the first liner layer and the first isolation region. The second liner layer and the first isolation region include different material compositions.

In accordance with at least one embodiment, a method comprises: forming a first fin stack and a second fin stack, including forming an oxide layer over nanostructures of the first fin stack and the second fin stack; forming a first liner layer over the first fin stack and the second fin stack; forming a second liner layer over the first liner layer; forming an isolation layer over the second liner layer; and forming an isolation region by recessing the isolation layer while the oxide layer is covered by the second liner layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device, comprising:

a substrate;

a first semiconductor fin protruding from the substrate and having a pair of first sidewalls opposite each other in a first lateral direction and a pair of second sidewalls opposite each other in a second lateral direction;

a second semiconductor fin protruding from the substrate and laterally offset from the first semiconductor fin;

a first semiconductor layer on the first sidewalls of the first semiconductor fin and on a top surface of the substrate between the first and second semiconductor fins;

a second semiconductor layer on the first semiconductor layer and in contact with the second sidewalls of the first semiconductor fin and separated from first sidewalls of the first semiconductor fin by the first semiconductor layer;

a first semiconductor channel over the first semiconductor fin;

a second semiconductor channel over the second semiconductor fin and laterally offset from the first semiconductor channel;

an isolation feature over the substrate and laterally between the first and second semiconductor fins, the isolation feature comprising an oxide material and having a top surface that is lower than a top surface of the first semiconductor fin, the isolation feature in contact with the second semiconductor layer and separated from the substrate and the first sidewalls of the first semiconductor fin by the first semiconductor layer and the second semiconductor layer; and a gate structure including a gate metal positioned between the top surface of the first semiconductor fin and a bottom surface of the first semiconductor channel.

2. The device of claim 1, wherein the first semiconductor layer has different etch selectivity than the isolation feature.

3. The device of claim 2, wherein the second semiconductor layer has substantially the same etch selectivity as the first semiconductor layer.

4. The device of claim 1, wherein the first semiconductor layer and the second semiconductor layer each comprise silicon germanium.

5. The device of claim 1, wherein the first semiconductor layer and the second semiconductor layer each has thickness in a range of about 1 nanometer to about 5 nanometers.

6. The device of claim 1, wherein the isolation feature comprises silicon oxide.

7. The device of claim 1, wherein upper surfaces of the first semiconductor layer and the second semiconductor layer are substantially coplanar with an upper surface of the isolation feature.

8. The device of claim 1, wherein the isolation feature includes:

a liner layer in physical contact with the second semiconductor layer; and a fill layer laterally surrounded by the liner layer.

9. The device of claim 1, further comprising an inactive fin structure over the isolation feature and laterally between the first semiconductor channel and the second semiconductor channel, wherein the gate structure is wrapped around the first semiconductor channel such that the gate structure surrounds the first semiconductor channel on all sides.

10. A device comprising:

a substrate;

a first isolation region on the substrate;

a second isolation region on the substrate and laterally offset from the first isolation region in a first direction;

a first semiconductor fin protruding from the substrate between the first and second isolation regions, the first and second isolation regions each having a top surface that is lower than a top surface of the first semiconductor fin, on a side of the semiconductor fin;

a first inactive fin structure on the first isolation region;

a second inactive fin structure on the second isolation region;

a first gate all around transistor including a channel above the first semiconductor fin and laterally between the first isolation region and the second isolation region;

a first semiconductor layer in contact with a first pair of opposing sidewalls of the first semiconductor fin and a top surface of the substrate below the first and second isolation structures; and a second semiconductor layer in contact with the first semiconductor layer and the first isolation region, wherein the second semiconductor layer is in contact with a pair of second opposing sides of the first semiconductor fin.

11. The device of claim 10, wherein the first semiconductor layer has different etch selectivity than the first isolation region.

12. The device of claim 10, further comprising:

a second semiconductor fin protruding from the substrate and laterally offset from the first gate all around transistor.

13. The device of claim 12, wherein the second semiconductor layer is in contact with the substrate between the first semiconductor fin and the second semiconductor fin.

14. The device of claim 10, wherein the first and second isolation regions comprise an oxide material, and the first and second semiconductor layers comprise silicon or silicon germanium.

15. A device, comprising:

a first fin stack including a first nanostructure, and a first sidewall;

a second fin stack including a second nanostructure, wherein the first sidewall is facing the second fin stack;

a first liner layer in contact with two opposing sides of the first fin stack; and a second liner layer on the first liner layer, the second liner layer including a first recess between the first fin stack and the second fin stack, wherein the second liner layer is in contact with two different opposing sides of the first fin stack; and an isolation region in the first recess, wherein the isolation region comprises silicon oxide, and the first and second liner layers each comprise a semiconductor material, wherein the semiconductor material is silicon germanium.

16. The device of claim 15, further comprising:

an inactive fin structure over the isolation region; and a gate structure over the first and second fin stacks and the inactive fin structure, wherein the gate structure wraps around the first nanostructure and the second nanostructure.

17. The device of claim 15, wherein the first fin stack further includes:

a second sidewall facing a first direction transverse to a second direction, the first fin stack and the second fin stack being on the second direction, wherein the second liner layer is in contact with the second sidewall.

18. The device of claim 15, wherein the isolation region has a top surface that is lower than a bottom surface of the first nanostructure.

19. The device of claim 18, wherein the first liner layer has a top surface that is lower than the bottom surface of the first nanostructure.

20. The device of claim 19, wherein the second liner layer has a top surface of the first nanostructure.

* * * * *